(12) United States Patent
Yamanaka et al.

(10) Patent No.: US 6,819,140 B2
(45) Date of Patent: Nov. 16, 2004

(54) SELF-SYNCHRONOUS LOGIC CIRCUIT HAVING TEST FUNCTION AND METHOD OF TESTING SELF-SYNCHRONOUS LOGIC CIRCUIT

(75) Inventors: Hidekazu Yamanaka, Tenri (JP); Takashi Horiyama, Yamatokoriyama (JP)

(73) Assignee: Sharp Kabushiki Kaisha, Osaka (JP)

( * ) Notice: Subject to any disclaimer, the term of this patent is extended or adjusted under 35 U.S.C. 154(b) by 19 days.

(21) Appl. No.: 10/448,076

(22) Filed: May 30, 2003

(65) Prior Publication Data

US 2003/0226083 A1 Dec. 4, 2003

(30) Foreign Application Priority Data

May 30, 2002 (JP) ........................................ 2002-157567

(51) Int. Cl.[7] ........................ H03K 19/00; G01R 31/28; G06F 11/22
(52) U.S. Cl. ........................................ 326/93; 714/744
(58) Field of Search .................... 326/16, 93; 714/726, 714/727, 744

(56) References Cited

U.S. PATENT DOCUMENTS 6,140,836 A * 10/2000 Fujii et al. .................... 326/35
6,356,117 B1 * 3/2002 Sutherland et al. ........... 326/93
6,590,424 B2 * 7/2003 Singh et al. ................... 326/93

FOREIGN PATENT DOCUMENTS

JP        06232732 A    * 8/1994 ................. 326/121
JP        2002005997       1/2002

* cited by examiner

Primary Examiner—Daniel D. Chang
(74) Attorney, Agent, or Firm—Harness, Dickey & Pierce, P.L.C.

(57) ABSTRACT

A self-synchronous logic circuit includes scan test compliant registers holding data and forming stages of a pipeline, and scan test compliant self-synchronous signal control circuits corresponding to respective registers and performing handshake to transfer clocks. In accordance with the clocks transferred by the scan test compliant self-synchronous signal control circuits, data processing among the scan test compliant registers proceeds. In addition to normal data processing, the scan test compliant registers have a function of serially transferring contents thereof at the time of a test. The scan test compliant self-synchronous signal control circuits are set to a state that corresponds to the end of a third way of the handshake, at the time of a test.

6 Claims, 15 Drawing Sheets

SELF-SYNCHRONOUS LOGIC CIRCUIT HAVING TEST FUNCTION AND METHOD OF TESTING SELF-SYNCHRONOUS LOGIC CIRCUIT

BACKGROUND OF THE INVENTION

1. Field of the Invention

The present invention relates to a self-synchronous logic circuit having a test function and to a method of testing a self-synchronous logic circuit. More specifically, the present invention relates to a self-synchronous logic circuit having a function of testing a logic circuit having a self-synchronous pipeline and to a method of testing a self-synchronous logic circuit.

2. Description of the Background Art

Generally, a logic circuit in an LSI (Large Scale Integration) forms a pipeline in which a plurality of stages are connected in series, with state storing elements such as flip-flops serving as boundaries. Data processing in the pipeline proceeds such that the data to be processed is input to a head stage of the serial connection (hereinafter simply referred to as the head stage), processing is done in each stage, and eventually, a result of processing is output from the last stage. In a synchronous circuitry, all the stages of the pipeline operate in synchronization with a common clock. Logic circuits, however, come to have ever increasing scale, higher speed of operation, and smaller design rule, and therefore, it becomes more and more difficult to attain clock distribution with adjusted delays that is necessary in physical design of synchronous circuits over an entire chip or an entire module. Accordingly, LSI logic circuits such as a data driven processor having a self-synchronous pipeline have been proposed, in which clock distribution is performed only within the stages of the pipeline, and clocks are transferred by handshake between the stages of the pipeline so as to eliminate the necessity of a common clock to attain synchronization. Each stage of the pipeline of the data driven processor includes a self synchronous signal control circuit handling clock transfer, and a circuit for data processing. In the entire pipeline, the former is in charge of clock transfer, and the latter provides a data path. (In the following description, the stage of interest will be sometimes referred to as the present stage, the stage preceding the stage of interest will be simply referred to as the preceding stage, and the stage succeeding the stage of interest will be simply referred to as the succeeding stage. Further, the n-th stage from the head stage will be simply referred to as the n-th stage.)

FIG. 8 shows a characteristic portion of a conventional logic circuit having a self-synchronous pipeline. Referring to FIG. 8, pipeline stage registers (hereinafter simply referred to as registers) 804, 805 and 806 each constitute a stage of the pipeline successively transferring a data path input from a preceding stage to a succeeding stage. Between an output of register 804 and an input of register 805, a combination circuit 107 is connected, and between an output of register 805 and an input of register 806, a combination circuit 108 is connected. Combination circuits 107 and 108 process data output from registers 804 and 805 of the preceding stages, respectively, and are formed simply by a combination of basic gate circuits, without any circuit such as a flip-flop for holding an internal state.

Corresponding to registers 804, 805 and 806, self-synchronous signal control circuits 801, 802 and 803 are provided, respectively. Self-synchronous signal control circuits 801, 802 and 803 handshake with each other while outputting, from a terminal CP, clock pulses to the corresponding registers. Upon reception of the clock pulses from the corresponding self-synchronous signal control circuits, registers 804, 805 and 806 take data from the preceding stage, hold the same and output to the succeeding stage.

FIG. 9 is a specific block diagram of the self-synchronous signal control circuit shown in FIG. 8. Referring to FIG. 9, a request signal CI representing, by two states of the signal, transfer request and transfer complete is input from the preceding stage to a CI input terminal 201. An RO output terminal 202 returns to the preceding stage an acknowledge signal RO that represents, by two states of the signal, transfer permission permitting output of the transfer request of the request signal CI from the preceding stage, and transfer reception indicating reception of the transfer request. In accordance with the request signal CI of the preceding stage indicating transfer complete and the acknowledge signal RI from the succeeding stage indicating transfer permission, a CP output terminal 205 issues a clock pulse for storing data in the register. A CO output terminal 203 applies, through a delay element 210 to the succeeding stage, a request signal representing, by two states of the signal, transfer request and transfer complete. An RI input terminal 204 receives, from the succeeding stage, an acknowledge signal RI representing, by two states of the signal, transfer permission permitting output of the transfer request from the CO output terminal 203 to the succeeding stage, and transfer reception indicating reception of the transfer request by the succeeding stage.

Further, the self-synchronous signal control circuit includes a flip-flop 901, a 4-input NAND gate 209 and a flip-flop 208. Flip-flop 901 holds a transfer request receiving state, flip-flop 208 holds a transfer request issuing state for the succeeding stage, and NAND gate 209 attains synchronization among flip-flops 901, 208, the CI input and the RI input. The request signal CI is input to an S input terminal of flip-flop 901, and the request signal CI is also applied to one input terminal of NAND gate 209. A Q output signal of flip-flop 901 is applied to one input terminal of NAND gate 209, and a Q-inverted output (/Q) of flip-flop 901 is output to an RO output terminal 202. The RI signal that has been input to RI input terminal 204 is applied to one input of NAND gate 209 and a reset input terminal of flip-flop 208. An output signal of NAND gate 209 is applied to a reset input terminal of flip-flop 901 and to a set input terminal of flip-flop 208. The Q output of flip-flop 208 is output to a CP output terminal 205, and the Q-inverted output (/Q) is applied to a CO output terminal 203 and to NAND gate 209.

An MRB input terminal 206 supplies a reset signal MRB for setting flip-flops 901 and 208 to the initial state.

FIGS. 10A to 10L are timing charts illustrating the operation related to FIGS. 8 and 9. The timing charts represent changes of signals related to self-synchronous signal control circuit 801 at CI input terminal 801CI, CO output terminal 801CO, RI input terminal 801RI, RO output terminal 801RO, and CP output terminal 801CP. Similarly, changes of signals related to self-synchronous signal control circuit 802 at CI input terminal 802CI, CO output terminal 802CO, RI input terminal 802RI, RO output terminal 802RO and CP output terminal 802CP are represented, and changes of signals related to self-synchronous signal control circuit 803 at CI input terminal 803CI, CO output terminal 803CO, RI input terminal 803RI, RO output terminal 803RO and CP output terminal 803 CP are represented. FIGS. 10A to 10L represent an operation when transfer request/complete is input once, with the stages of the pipeline being empty.

Timings T1 to T4 are indicated in FIGS. 10B and 10C to facilitate understanding of the operation. The operation will be described with reference to FIGS. 8, 9 and 10A to 10L.

First, flip-flops 901 holding transfer request receiving state and flip-flops 208 holding the transfer request issuing state of the self-synchronous signal control circuits of all the stages are reset by a pulse input of the reset signal MRB shown in FIG. 10A. At this time, RO output terminals are at the transfer permission state of H, and the CO outputs are at the transfer complete state of H in all self-synchronous signal control circuits.

To the CI input terminal 801CI of self-synchronous signal control circuit 801 as the first stage of the pipeline shown in FIG. 8, a transfer request by the request signal CI shown in FIG. 10B is input (see timing T1: change from H to L, first way of the handshake between the input and the first stage). In response, flip-flop 901 holding the transfer request receiving state of self-synchronous signal control circuit 801 is set, and from the RO output terminal 801RO of self-synchronous signal control circuit 801 to the preceding stage of the pipeline, transfer reception by the acknowledge signal RO shown in FIG. 10C is output (see timing T2: change from H to L, second way of the handshake between the input and the first stage). About that time, data to be processed is input to a data path input of register 804.

Thereafter, to the CI input terminal 801CI of self-synchronous signal control circuit 801, transfer complete is input by the request signal CI shown in FIG. 10B (see timing T3: change from L to H, third way of the handshake between the input and the first stage), and in response, NAND gate 209 is activated. Thus, flip-flop 208 holding the transfer request issuing state of self-synchronous signal control circuit 801 is set, the CP output terminal 801CP of self-synchronous signal control circuit 801 changes from L to H as shown in FIG. 10D (that is, a clock pulse is output), and data is latched in register 804. At the same time, from the CO output terminal 801CO of self-synchronous signal control circuit 801 to the second stage of the pipeline, transfer request by the request signal CO shown in FIG. 10E is output through delay element 210 (change from H to L, first way of the handshake between the first stage and the second stage), and NAND gate 209 of self-synchronous signal control circuit 801 is inactivated. Thus, flip-flop 901 holding the transfer request receiving state is reset. Then, from the RO output terminal 801RO of self-synchronous signal control circuit 801 to the preceding stage, transfer permission by the acknowledge signal RO shown in FIG. 10C is output (see timing T4: change from L to H, fourth way of the handshake between the input and the first stage).

To the CI input terminal 802CI of self-synchronous signal control circuit 802 as the second stage of the pipeline, a transfer request is input by the request signal CI shown in FIG. 10E (change from H to L, first way of the handshake between the first stage and the second stage), and in response, flip-flop 901 holding the transfer request receiving state of self-synchronous signal control circuit 802 is set. Then, from the RO output terminal 802RO of self-synchronous signal control circuit 802 to the first stage of the pipeline, transfer reception by the acknowledge signal RO shown in FIG. 10F is output (change from H to L, second way of the handshake between the first stage to the second stage).

About that time, processed data that has been processed by combination circuit 107 is input to a data input of register 805. To the RI input terminal 801RI of self-synchronous signal control circuit 801 as the first stage of the pipeline, transfer reception by the acknowledge signal RI shown in FIG. 10F is input (change from H to L, second way of the handshake between the first stage and the second stage), and in response, flip-flop 208 holding the transfer request issuing state of self-synchronous signal control circuit 801 is reset. The CP output terminal 801CP of self-synchronous signal control circuit 801 attains from H to L, and at the same time, from the CO output terminal 801CO of self-synchronous signal control circuit 801 to the second stage of the pipeline, transfer complete by the request signal CO shown in FIG. 10E is output through delay element 210 (change from L to H, third way of the handshake between the first stage and the second stage).

When the transfer complete is input (change from L to H, third way of the handshake between the first stage and the second stage) to the CI input terminal 802CI of self-synchronous signal control circuit 802 as the second stage of the pipeline, NAND gate 209 of self-synchronous signal control circuit 802 is activated. In response, flip-flop 208 holding the transfer request issuing state of self-synchronous signal control circuit 802 is set, the CP output terminal 802CP of self-synchronous signal control circuit 802 attains from L to H as shown in FIG. 10G, and data is latched in register 805. At the same time, from the CO output terminal 802CO of self-synchronous signal control circuit 802 to the third stage of the pipeline, transfer request by the request signal CO shown in FIG. 10H is output through delay element 210 (change from H to L, first way of the handshake between the second stage and the third stage), and NAND gate 209 of self-synchronous signal control circuit 802 is inactivated. Thus, flip-flop 901 holding the transfer request receiving state of self-synchronous signal control circuit 802 is reset, and from the RO output terminal 802RO of self-synchronous signal control circuit 802 to the first stage of the pipeline, transfer permission by the acknowledge signal RO shown in FIG. 10F is output (change from L to H, fourth way of the handshake between the first stage and the second stage).

The operation proceeds in the similar manner between the second stage and the third stage. The CP output terminal 802CP of self-synchronous signal control circuit 802 changes from H to L as shown in FIG. 10G, the CP output terminal 803CP of self-synchronous signal control circuit 803 changes from L to H, and then further changes from H to L as shown in FIG. 10J. At this time, the CO output terminal 802CO and the RI input terminal 802RI of self-synchronous signal control circuit 802 change as shown in FIGS. 10H and 10I. Thereafter, the CO output terminal 803CO and the RI input terminal 803RI of self-synchronous signal control circuit 803 change as shown in FIGS. 10K and 10L.

In this manner, in response to the transfer request represented by transfer request signals CI and CO, clock pulses and data are transferred through the pipeline (or a plurality of stages), by four-way handshakes between the self-synchronous signal control circuits.

FIGS. 11A to 11L are timing charts of another exemplary operation of the self-synchronous signal control circuits shown in FIG. 8, representing an operation in which transfer permission/reception is input once with all the stages of the pipeline being full with data. By the reset signal MRB shown in FIG. 11A, the entire circuitry is reset, and thereafter, by the acknowledge signal RI, the transfer reception state of L shown in FIG. 11L is input to the RI input terminal 803RI of self-synchronous signal control circuit 803 as the third stage, that is, the last stage of the pipeline.

In this state, by the request signal CI, transfer request (change from H to L)/complete (change from L to H) shown at timings T1 and T3 of FIG. 11B is input three times to the CI input terminal 801CI of self-synchronous signal control circuit 801 as the first stage of the pipeline. Accordingly, as can be seen at timings T2 and T4 of FIG. 11C, the signal at RO output terminal 801RO of self-synchronous signal control circuit 801 of the first stage stops at T2 of the third operation. During this period, the transfer request/complete shown in FIG. 11E is input twice to the CI input terminal 802CI of self-synchronous signal control circuit 802 of the second stage, and the transfer request/complete shown in FIG. 1H is input once to the CI input terminal 803CI of self-synchronous signal control circuit 803 of the third stage. As a result, the stages of the pipeline are filled with data. Thus, the circuitry is in a state waiting for a transfer permission from the acknowledge signal RI shown in FIG. 11L (the state after the third way of the handshake among all the stages).

Thereafter, when transfer permission (change from L to H)/reception (change from H to L) is input to the RI input terminal 803RI of self-synchronous signal control circuit 803 as the third stage, that is, the last stage of the pipeline, by the acknowledge signal RI, the transfer permission/reception signal is propagated in a direction opposite to the direction of the data flow through the pipeline, in the order of terminal 803RO of FIG. 11I→ terminal 802RI of FIG. 11I→ X terminal 802RO of FIG. 11F→ terminal 801RI of FIG. 11F→terminal 801RO of FIG. 11C, through connection from acknowledge signal RO to RI. Correspondingly, clock pulses are also generated in a direction opposite to the direction of the data flow through the pipeline, in the order of terminal 803CP of FIG. 11J→ terminal 802CP of FIG. 11G terminal 801CP of FIG. 11D.

The operation at this time including the register side is as follows. Upon reception of transfer permission of the succeeding stage of the pipeline, the third stage, that is, the last stage, of the pipeline latches the output from combination circuit 108 in register 806, and thereafter, applies transfer permission to the second stage of the pipeline. In response, the second stage of the pipeline latches the output from combination circuit 107 in register 805, and thereafter applies transfer permission to the first stage of the pipeline. In response, the first stage of the pipeline latches the data from the data path input. As can be understood, the operation is under the severest hold timing condition for the registers.

By connecting the necessary number of stages in such a pipeline configuration as shown in FIG. 8, it becomes possible to realize the series of data processing without necessitating clock distribution over the entire chip or module.

It is a general practice to perform a test on an LSI before shipment to confirm whether circuits are manufactured without any defect, by inputting test signals to all logic circuits. In order to perform a test to detect any defect in combination circuits between stages of a pipeline of an LSI, it is necessary to input data of necessary and sufficient number of patterns to the input of the combination circuit for each stage of the pipeline, and to compare the outputs with the expected values.

As the LSI comes to have larger scale and hence larger number of stages in the pipeline, it becomes difficult to apply desired inputs to combination circuits of intermediate stages and to obtain outputs therefrom, and long test vector length and long period of vector development are required.

For this reason, scan test method is generally used for circuits that operate in accordance with a common clock, in which each register is adapted to have a function enabling switching between a normal input and test input, and for an input of a test, outputs of other registers are connected in a string. Here, the shift register path that is formed by connecting in string the registers one by one is generally referred to as a scan chain.

FIG. 12 shows an example of a synchronous circuitry operating in accordance with a common clock corresponding to the scan test method. The synchronous circuitry shown in FIG. 12 includes scan compliant registers (hereinafter simply referred to as registers) 104, 105 and 106, and combination circuits 107 and 108 not having any internal state, performing operations and the like between the stages of the pipeline. Referring to FIG. 12, a common clock CLK and a scan test enable signal SE are supplied to each of the registers 104 to 106. The scan test enable signal SE is a signal for switching whether the scan chain is to be made valid or not.

Registers 104, 105 and 106 including the scan chain each have the same configuration shown in FIG. 13. Referring to FIG. 13, each register includes selectors 13011, 13012, 13013 to 1301n, registers 13021, 13022, 13023 to 1302n, a terminal 1308 receiving as an input the common clock CLK, terminals 13031, 13032, 13033 to 1303n receiving as inputs normal data D0, D1, D2 to Dn, terminals 13041, 13042, 13043 to 1304n outputting latched normal data Q0, Q1, Q2 to Qn, a terminal 1305 to which input data SI to the scan chain is supplied, a terminal 1306 providing an output data SO from the scan chain, and a terminal 1307 for receiving as an input the scan test enable signal SE.

When the scan chain in invalid, each register performs a normal operation in which normal data D0, D1, D2 to Dn input every time the common clock CLK is input is latched. When the scan chain is valid, values of the registers are shifted-in from the data input side of the scan chain and shifted-out to the data output side of the scan chain simultaneously, in accordance with the order of connection of the scan chain, every time the common clock CLK is input.

Overall scan test procedure will be described. First, the scan test enable signal SE is input to make the scan chain valid, and input data SI that has been set to a desired test value is set in the internal registers through the scan chain. Thereafter, the scan test enable signal SE is input to make the scan chain invalid, one pulse of common clock CLK is input to latch the output of a combination circuit between each of the stages of the pipeline, the scan test enable signal SE is again input to make the scan chain valid, and the value latched in the register is taken out through the scan chain and compared with the expected value. At the same time, a next test input value is set in the internal register through the scan chain. The circuitry is tested by repeating this procedure.

By using this scan test method, it becomes possible to set a desired input value and to take out an output value through the scan chain, from an intermediate stage of a pipeline consisting of multiple stages, and therefore, even a large scale circuit can be tested.

The above described scan test, however, requires the common clock CLK at the time of testing. Therefore, this cannot be applied to the self-synchronous pipeline shown in FIG. 8. Though the self-synchronous pipeline facilitates physical design of LSIs that come to have larger scale, higher degree of miniaturization and higher speed of operation, it still has a problem that testing becomes more difficult as the circuit scale becomes larger.

In view of the foregoing, the applicant proposed a circuit configuration shown in FIG. 14 as a solution to this problem, in Japanese Patent Laying-Open No. 2002-5997 entitled "Self-Synchronous Logic Circuit Having Test Circuit."

The circuitry shown in FIG. 14 includes registers 104, 105 and 106 having a configuration similar to that shown in FIG. 13 including a scan chain, scan test compliant self-synchronous signal control circuits 1401, 1402 and 1403, combination circuits 107 and 108 performing an operation and the like between stages of the pipeline and not having any internal state, and a selector 1406.

Selector 1406 switches and outputs, based on an input scan clock switching signal 1404, either an applied acknowledge signal RI of a normal handshake or a scan test clock 1405.

The scan test compliant self-synchronous signal control circuits 1401 to 1403 of FIG. 14 each have the same configuration shown in FIG. 15. Referring to FIG. 15, the circuit includes a CI input terminal 201 receiving as inputs transfer request and transfer complete represented by two states of the request signal CI from the preceding stage of the pipeline, an RO output terminal 202, a CO output terminal 203 transmitting the transfer request and the transfer complete to the succeeding stage of the pipeline, an RI input terminal 204, a CP terminal 205, an input terminal 206 for the reset signal MRB, and a terminal 1503 receiving as an input the scan clock switching signal 1404. In a normal operation, RO output terminal 202 returns transfer permission permitting an output of transfer request and transfer reception indicating receipt of the transfer request from CI input terminal 201, represented by two states of the signal, to the preceding stage of the pipeline, and in a scan test operation, the terminal directly outputs the scan clock signal input from RI input terminal 204. In a normal operation, RI input terminal 204 receives transfer permission permitting output of the transfer request and transfer reception indicating receipt of the transfer request from CO output terminal 203, represented by two states of the signal, from the succeeding stage of the pipeline, and in a scan test operation, receives as an input the scan clock. In a normal operation, in accordance with receiving transfer complete from the preceding stage of the pipeline and transfer permission from the succeeding stage of the pipeline, CP terminal 205 supplies a clock pulse to the register of the present stage, and at the time of a test, the terminal directly outputs the scan clock signal input from RI input terminal 204.

The circuit of FIG. 15 further includes a delay element 210 delaying the transfer request/complete signal, a flip-flop 901 holding a transfer request receiving state from the preceding stage of the pipeline, a flip-flop 208 holding a transfer request issuing state to the succeeding stage of the pipeline, an NAND gate 209 establishing synchronization between the CI input and the RI input as well as flip-flop 901 and flip-flop 208, a selector 1501 for switching which of the transfer permission/reception signal and the scan clock input from the succeeding stage of the pipeline through RI input terminal 204 is to be provided to RO output terminal 202, and a selector 1502 for switching which of the normal clock generated as a result of a handshake and the scan clock input from the succeeding stage of the pipeline through RI input terminal 204 is to be provided to CP output terminal 205. Reset signal MRB functions to set flip-flops 901 and 208 to the initial state.

By this configuration, signal levels of CP output terminals 205 of scan test compliant self-synchronous signal control circuits 1401, 1402 and 1403 can be determined by the scan clock provided from RI input terminals 204 through RO output terminals 202 of the scan test compliant self-synchronous signal control circuits at the time of a scan test, and therefore, a common clock can be supplied to the scan test compliant registers 104, 105 and 106, which means that the scan test method is applicable to this circuitry.

By the circuitry shown in FIGS. 14 and 15, a configuration is provided that enables application of the scan test to the self-synchronous pipeline. In this configuration, however, timings must be carefully adjusted to avoid a problem of hold timing at the time of a scan test, by performing clock distribution with delays aligned to some extent for the scan clock used at the time of a scan test, or by adding a delay cell or delay cells in a path of propagating the scan clock from the acknowledge signal RI input to the acknowledge signal RO output, to intentionally shifting the phases of the scan clock between the stages of the pipeline.

When the former approach is taken, the advantage of the self-synchronous pipeline that facilitates physical design by performing clock distribution only within the stages of the pipeline is lost. When the latter approach is taken, a delay cell of a relatively large size is required separately.

In the configuration above, the clock system used at the time of a scan test is fundamentally switched from the clock system used in a normal operation. Therefore, clock phase relation between the stages of the pipeline at the time of a scan test is different from that in a normal operation. This means that a timing test in a normal operation must be performed separately. Particularly, in a hold timing test, stages of the pipeline must be operated filled with process data, as shown in the timing charts of FIGS. 11A to 11L. Therefore, the test is very difficult.

SUMMARY OF THE INVENTION

An object of the present invention is to provide a self-synchronous logic circuit having a function of enabling an easy test by a simple configuration, and to provide a method of testing a self-synchronous logic circuit.

In order to attain the above described objects, the present invention provides, according to an aspect, a self-synchronous logic circuit having a test function including registers holding data and connected in multiple stages for a pipeline, and a self-synchronous signal control circuit provided corresponding to each of the registers.

When transfer permission is applied to a preceding stage of the pipeline in the first way, the self-synchronous signal control circuit receives as an input transfer request from the preceding stage of the pipeline together with data output from the register of the preceding stage of the pipeline, upon reception of the transfer request, applies transfer reception to the preceding stage of the pipeline in the second way, when the transfer reception is received by the preceding stage of the pipeline, receives as an input transfer complete from the preceding stage of the pipeline in the third way, and when the transfer complete is received and transfer permission is applied from the succeeding stage of the pipeline in the fourth way, applies transfer permission to the preceding stage of the pipeline, makes the register take and hold data from the preceding stage of the pipeline, output the data to the succeeding stage of the pipeline and applies transfer request to the succeeding stage of the pipeline.

The register has a function of successively transferring data in a normal operation and at the time of a test. At the time of a test, all the self-synchronous signal control circuits are set to the state of the third way of handshaking, and thereafter, transfer permission and transfer reception are applied to the self-synchronous signal control circuit of the last stage of the pipeline.

Therefore, at the time of a test, all the self-synchronous signal control circuits are set to the state of the third way, and thereafter, when transfer permission and transfer reception are applied to the self-synchronous signal control circuit of the last stage of the pipeline, all the self-synchronous signal control circuits make a transition to the fourth way successively in a direction from the last stage to the head stage of the pipeline, with the data from a preceding stage of the pipeline taken and held by the register and successively output to the register of a succeeding stage of the pipeline.

Therefore, even at the time of a test, data transfer procedure in accordance with four-way handshake can be utilized, and hence it is unnecessary to adjust with care timings of data transfer separately. The data hold timing test can be performed using the same timings as in a normal four-way handshake.

In the self-synchronous logic circuit having the test function described above, preferably, setting of all the self-synchronous signal control circuits to the state of the third way at the time of a test, and application of transfer permission and transfer reception to the self-synchronous signal control circuit of the last stage of the pipeline, are repeated.

Therefore, at the time of a test, all the self-synchronous signal control circuits make transition to the fourth way successively and repeatedly in the direction from the last stage to the head stage of the pipeline without applying any special timing signal, and all the data held in the stages of the pipeline can be transferred and provided.

Preferably, the self-synchronous logic circuit having the above described test function further includes a last stage signal processing unit for applying, at the time of a test, transfer request output by the self-synchronous signal control circuit of the last stage of the pipeline to the succeeding stage of the pipeline as transfer permission from the succeeding stage of the pipeline, to the self-synchronous signal control circuit itself.

Therefore, at the time of a test, every time the self-synchronous signal control circuit of the last stage of the pipeline makes a transition to the fourth way and applies transfer request to the succeeding stage of the pipeline, the transfer request is automatically applied as transfer permission by the last stage signal processing circuit to itself. Therefore, all the data held in the stages of the pipeline can surely be transferred and provided without applying any special timing signal.

Preferably, in the self-synchronous logic circuit having the test circuit described above, setting of all the self-synchronous signal control circuits to the state of the third way at the time of a test, application of transfer permission and transfer reception to the self-synchronous signal control circuit of the last stage of the pipeline, and application of transfer request and transfer complete to the self-synchronous signal control circuit at the head stage of the pipeline are repeated.

Therefore, at the time of a test, after all the self-synchronous signal control circuits make transition to the fourth way successively and repeatedly in a direction from the last stage to the head stage of the pipeline, transfer request and transfer complete are applied repeatedly to the self-synchronous signal control circuit of the head stage of the pipeline. Therefore, all the self-synchronous signal control circuits make transition to the first to the third ways successively and repeatedly in a direction from the last stage to the head stage of the pipeline. Therefore, the operation of supplying data from the head stage of the pipeline, transferring data and providing data at the last stage of the pipeline can be repeated without applying any special timing signal.

Preferably, the self-synchronous logic circuit having the test function described above further includes a head stage signal processing unit for applying, at the time of a test, transfer request output from the self-synchronous signal control circuit of the head stage of the pipeline to the succeeding stage as a transfer request to the self-synchronous signal control circuit itself.

Therefore, at the time of a test, every time the self-synchronous signal control circuit of the head stage of the pipeline makes a transition to the fourth way and applies transfer request to the succeeding stage of the pipeline, the transfer request is automatically applied to itself as transfer request by the head stage signal processing unit. Accordingly, all the self-synchronous signal control circuits make transition to the first to the third ways successively and repeatedly in a direction from the last stage to the head stage, without applying transfer request and transfer complete to the self-synchronous signal control circuit of the head stage of the pipeline. Therefore, the operation of supplying data from the head stage of the pipeline, transferring data, and providing data at the last stage of the pipeline can be repeated without applying any special timing signal.

According to an aspect, the present invention provides a method of testing a self-synchronous logic circuit for testing a self-synchronous logic circuit including registers holding data and connected in multiple stages for a pipeline, and a self-synchronous signal control circuit provided corresponding to each of the registers, the self-synchronous signal control circuit processing data while performing four-way handshake in which when transfer permission to a preceding stage is applied in a first way, a transfer request from the preceding stage is received as an input together with data output from the register of the preceding stage of the pipeline, upon input of the transfer request, transfer reception is applied to the preceding stage of the pipeline in a second way, when the transfer reception is received as an input by the preceding stage of the pipeline, transfer complete is received as an input from the preceding stage of the pipeline in a third way, and when the transfer complete is received as an input and transfer permission is applied from the succeeding stage of the pipeline in a fourth way, transfer permission is applied to the preceding stage of the pipeline and data from the preceding stage of the pipeline is taken and held by the register and data is output to the succeeding stage of the pipeline to apply transfer request to the succeeding stage of the pipeline. The register has a function of successively transferring data in a normal operation and at the time of a test. The method of testing includes the state setting step of setting all self-synchronous signal control circuits to the state of the third way of handshake at the time of a test, and after the setting by the state setting step, the step of applying transfer permission and transfer reception to the self-synchronous signal control circuit of the last stage of the pipeline.

Therefore, at the time of a test, after all self-synchronous signal control circuits are set to the state of the third way, when transfer permission and transfer reception are applied to the self-synchronous signal control circuit of the last stage of the pipeline, all self-synchronous signal control circuits make transition to the fourth way successively in a direction from the last stage to the head stage of the pipeline, and the data held in each of the registers are successively transferred to the register of the succeeding stage.

Therefore, even at the time of a test, the data transfer procedure of four-way handshake can be utilized, and therefore, it is unnecessary to adjust with care timings of data transfer separately, and a data hold timing test can be performed in accordance with the normal four-way handshake.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

First Embodiment

The self-synchronous logic circuit in accordance with the present embodiment has a plurality of self-synchronous signal control circuits for transferring clock pulses thorough four-way handshake between a plurality of stages of a pipeline. Each stage of the pipeline has a register for holding and transferring data. In accordance with clock pulses transferred by the self-synchronous signal control circuit, data processing between registers proceeds. The self-synchronous logic circuit has, in relation with the registers, a function of successively transferring data of the registers at the time of a test, in addition to the function of normal data processing, and in relation with the self-synchronous signal control circuit, a function enabling setting to the state after the end of the third way of handshake, at the time of a scan test.

Figure 1:
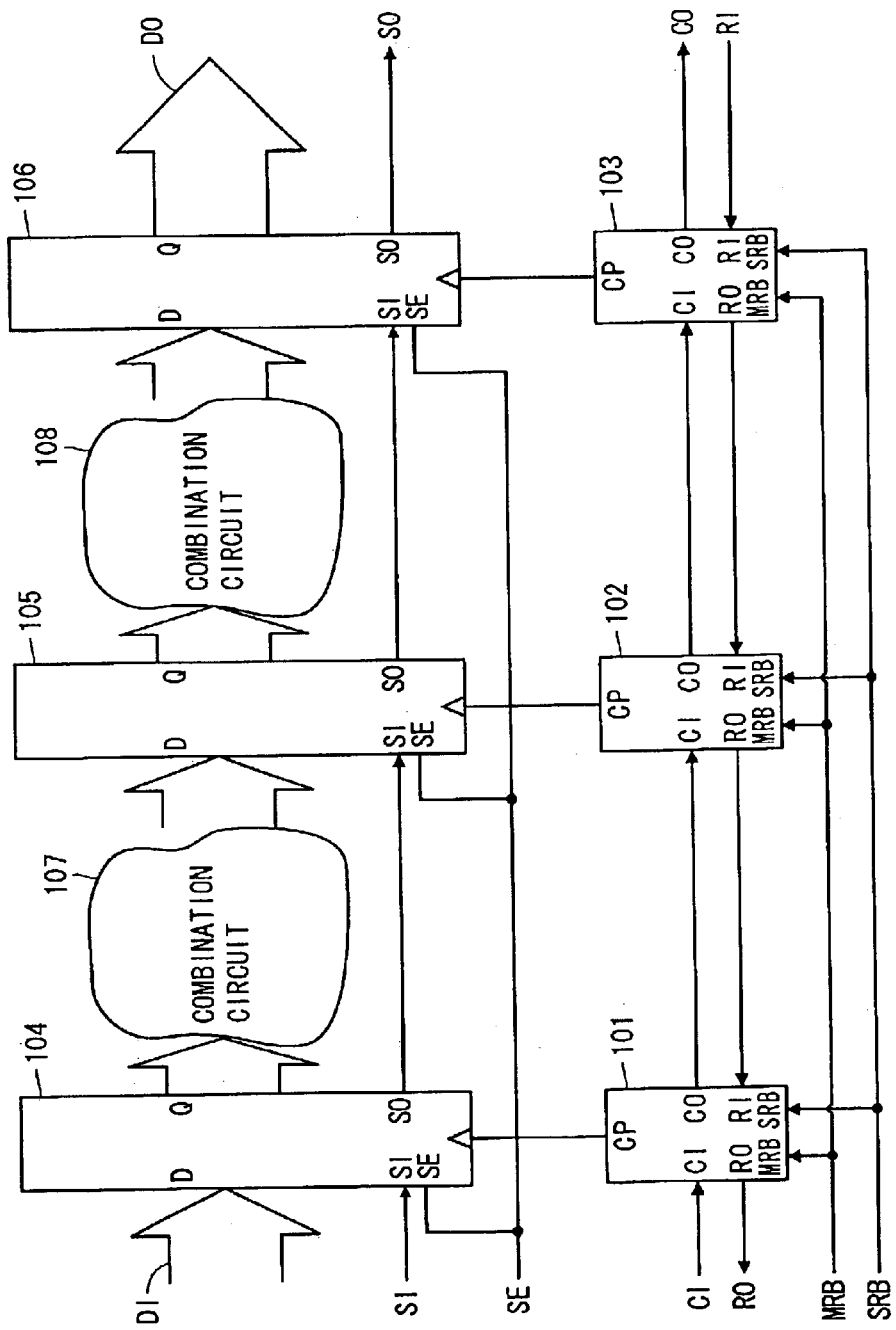
FIG. 1 shows a configuration of the self-synchronous logic circuit having a test circuit in accordance with a first embodiment.
Figure 13:
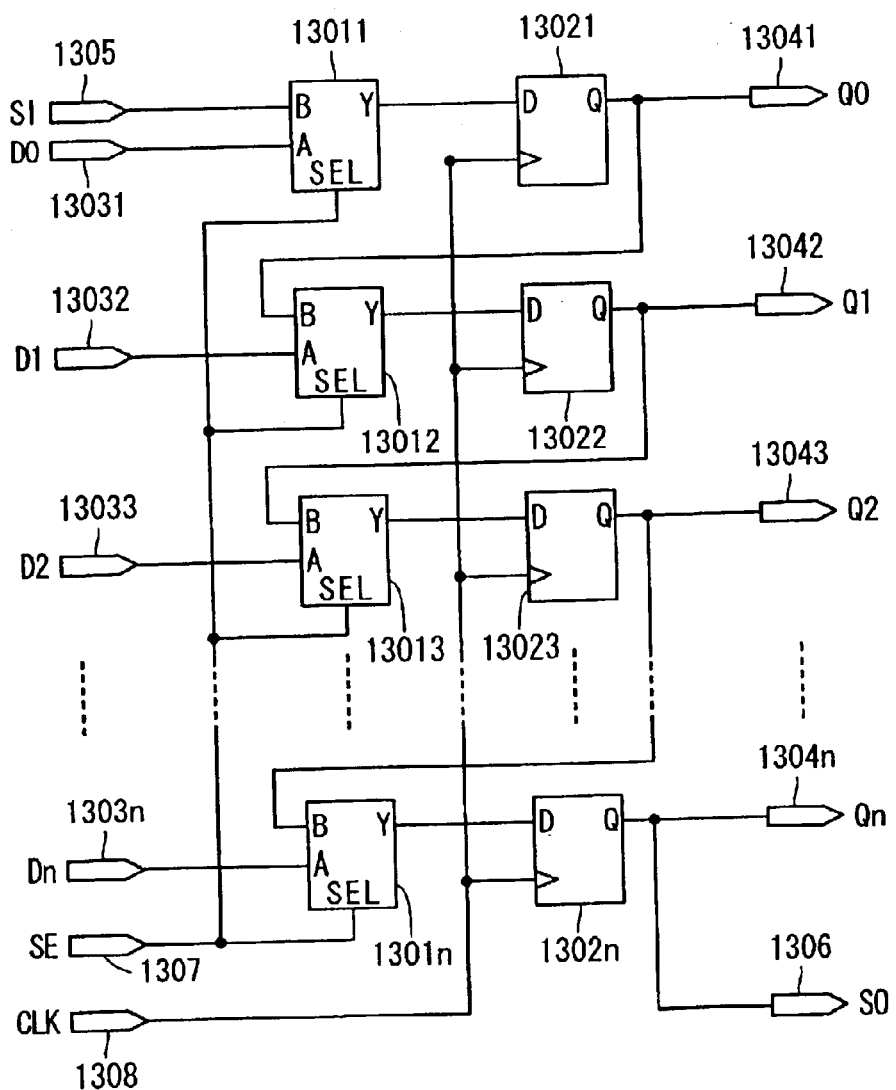
FIG. 13 is a block diagram of a register including the scan chain of FIG. 12.
Figure 14:
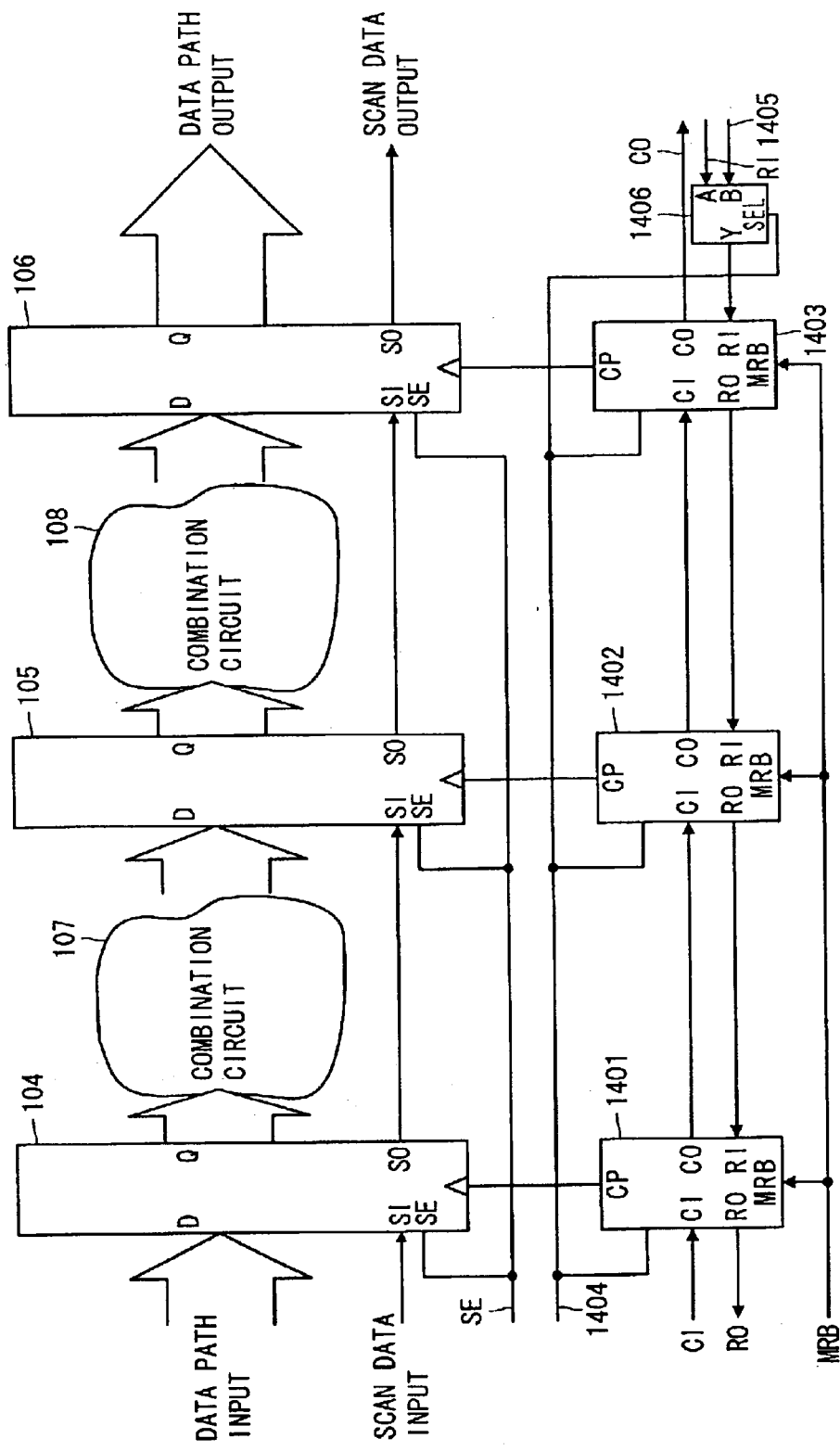
FIG. 14 is a block diagram of a conventional self-synchronous logic circuit having a test circuit.
Figure 15:
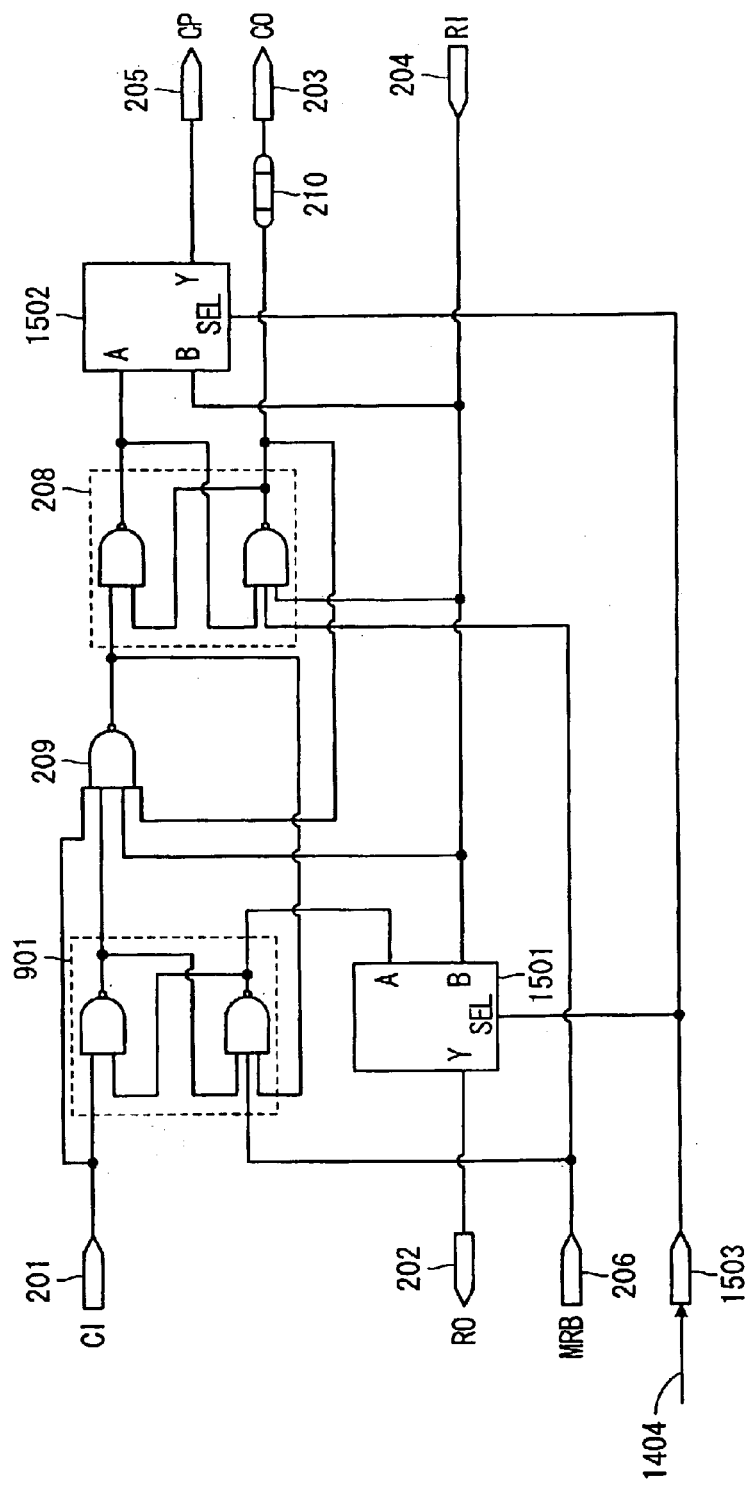
FIG. 15 is a block diagram of the scan test compliant self-synchronous signal control circuit.

FIG. 1 shows a configuration of a self-synchronous logic circuit having a test circuit in accordance with the first embodiment. Referring to FIG. 1, the circuit includes registers 104, 105 and 106 including a scan chain, having the same configuration as that of FIG. 13 and forming stages of a pipeline, scan test compliant self-synchronous signal control circuits 101, 102 and 103, and combination circuits 107 and 108 performing an operation and the like between the stages of the pipeline and not having any internal state. Registers 104, 105 and 106 are provided corresponding to three stages of the pipeline, respectively, and scan test compliant self-synchronous signal control circuits 101, 102 and 103 are provided corresponding to registers 104, 105 and 106, respectively. A data input path DI and a data output path DO of FIG. 1 represent normal data input and data output to and from the self-synchronous logic circuit. Scan data input and output SI and SO represent data input and data output to and from the scan chain, and scan test enable signal SE represents a signal switching whether the scan chain is to be made valid or not. In addition, as signals for the handshake, a request signal CI input to the self-synchronous logic circuit, a request signal CO output from the self-synchronous logic circuit, an acknowledge signal RI input to the self-synchronous logic circuit, and an acknowledge signal RO output from the self-synchronous logic circuit are shown, and further, the reset signal MRB and the scan reset signal SRB are shown. Here, the input of the acknowledge signal RI input to the self-synchronous logic circuit is also used as a trigger signal for inputting the scan clock at the time of a scan test.

Figure 2:
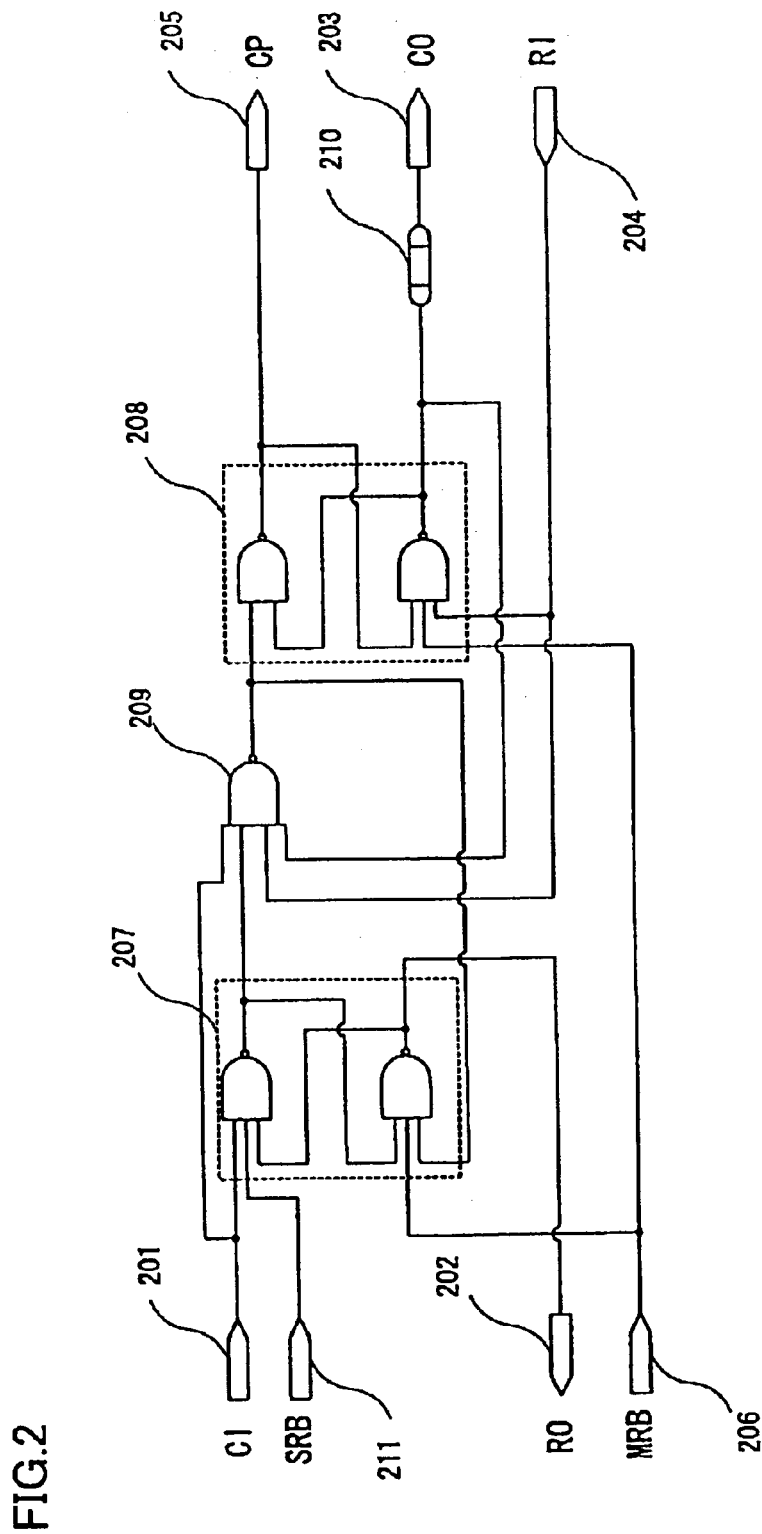
FIG. 2 shows an internal configuration of the scan test compliant self-synchronous signal control circuit of FIG. 1.

FIG. 2 shows an internal configuration of the scan test compliant self-synchronous signal control circuit of FIG. 1. Each of scan test compliant signal control circuits 101 to 103 has the same configuration as that of FIG. 2.

Referring to FIG. 2, the scan test compliant self-synchronous signal control circuit includes a CI input terminal 201 receiving as inputs, transfer request and transfer complete represented by two states of a signal from a preceding stage of the pipeline, an RO output terminal 202 returning transfer permission permitting output of the transfer request from the CI input terminal 201 and transfer reception indicating receipt of the transfer request, represented by two states of a signal, to the preceding stage of the pipeline, a CO output terminal 203 transmitting the transfer request and the transfer complete to the succeeding stage of the pipeline, an RI input terminal 204 receiving the transfer permission permitting output of the transfer request from the CO output terminal and the transfer reception indicating receipt of the transfer request, represented by two states of a signal, from the succeeding stage of the pipeline, in accordance with receiving the transfer complete from the preceding stage of the pipeline and the transfer permission from the succeeding stage of the pipeline, a CP terminal 205 supplying the clock pulse of the register of the present stage itself, a terminal 206 receiving, as an input, the reset signal MRB, and a terminal 211 receiving, as an input, the scan reset signal SRB.

The reset signal MRB input from terminal 206 is applied to flip-flops 207 and 208 to set these to the initial state. The scan reset signal input through terminal 211 is applied to flip-flop 207 that holds the transfer request receiving state and sets the same. Thus, the scan test compliant self-synchronous signal control circuit is set to the state at the end of the third way of the four-way handshake.

The circuit further includes a delay element 210 delaying the transfer request/complete signal, the flip-flop 207 holding the transfer request receiving state from the preceding stage of the pipeline, the flip-flop 208 holding a transfer request issuing state to the succeeding stage of the pipeline, and a NAND gate 209. NAND gate 209 establishes synchronization among the CI input, RI input, and flip-flops 207 and 208.

When the scan reset signal SRB is fixed at the H level as a nonactive value and the scan chain is invalid, the scan compliant self-synchronous signal control circuit of FIG. 2 performs a normal operation similar to that shown in FIGS. 10A to 10L and 11A to 11L.

The test method is as follows. In the initial step, all the self-synchronous signal control circuits are reset, and thereafter, the transfer reception/permission input of the self-synchronous signal control circuit of the tail (last stage) of the pipeline is set to L. Then, all the self-synchronous signal control circuits are set to the state that corresponds to the end of the third way of handshake, the transfer reception/permission input of the self-synchronous signal control circuit of the last stage is set from L→H→L, and clock pulses are supplied from the self-synchronous signal control circuits of all the stages to the registers. At the time of a test, the above described initial step is executed once, and steps following thereto are executed repeatedly.

The operation of the scan test compliant self-synchronous signal control circuits shown in FIGS. 1 and 2 will be described with reference to the timing charts of FIGS. 3A to 3M. To facilitate understanding of the operation, a timing T3 is given in the timing charts of FIGS. 3A to 3M.

The timing charts represent change of signals at CI input terminal 101CI, CO output terminal 101CO, RI input terminal 101RI, RO output terminal 101RO, and CP output terminal 101CP, with respect to scan compliant self-synchronous signal control circuit 101. Similarly, change of signals at CI input terminal 102CI, CO output terminal 102CO, RI input terminal 102RI, RO output terminal 102RO, and CP output terminal 102CP are represented with respect to scan compliant self-synchronous signal control circuit 102, and change of signals at CI input terminal 103CI, CO output terminal 103CO, RI input terminal 103RI, RO output terminal 103RO, and CP output terminal 103CP are represented with respect to scan compliant self-synchronous signal control circuit 103.

Figure 3:
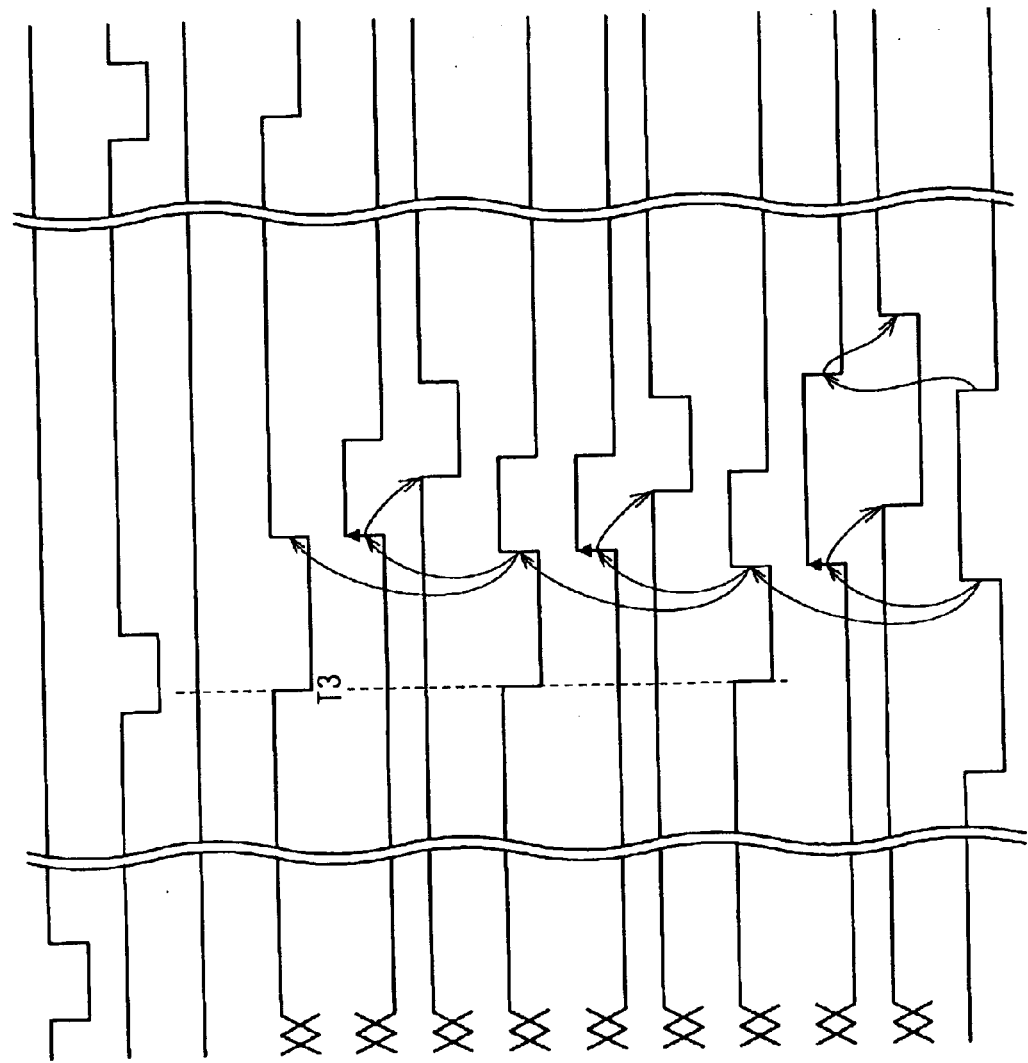
FIGS. 3A to 3M are timing charts representing an operation of the scan test compliant self-synchronous signal control circuit shown in FIGS. 1 and 2, at the time of a scan test.

First, by the input of the reset MRB shown in FIG. 3A, the circuit is reset. Thereafter, the RI input 103RI shown in FIG. 3M of scan compliant self-synchronous signal control circuit 103 of the third stage, that is, the last stage, of the pipeline of FIG. 1 is set to the transfer reception state L through the RI input RI of the circuit, and then, the scan reset signal SRB is input as an active pulse of H→ L→ H as shown in FIG. 3B. In response, flip-flop 207 holding the transfer request receiving state from the preceding stage of the pipeline in every scan compliant self-synchronous signal control circuit is set. Accordingly, in all the scan compliant self-synchronous signal control circuits, the acknowledge signal RO output as shown in FIGS. 3D, 3G and 3J are set to the transfer reception state L and the request signal CO output as shown in FIGS. 3F, 3I and 3L are set to the transfer complete state H, as can be seen at the transition at timing T3, and thus, the circuits are set to the state at the end of the third way of four-way handshake.

At this time, though the request signal CI input as shown in FIGS. 3C, 3F and 3I (request signal CO output from the preceding stage) is at H and flip-flop 207 holding the request receiving state is set, the acknowledge signal RI input as shown in FIGS. 3G, 3J and 3M (acknowledge signal RO from the succeeding stage) attains to L. Therefore, NAND gate 209 is not activated, and unless the input acknowledge signal RI (acknowledge signal RO from the succeeding stage) attains to H, transfer request to the succeeding stage by the request signal (change from H to L) is not made.

When the scan reset signal SRB changes from H→ L for the first time after the reset by the input of reset signal MRB, because of delay and difference in delay until the acknowledge signals RO output from respective scan test compliant self-synchronous signal control circuits attain to the transfer reception state of L, the change of H→ L of the acknowledge signal RI input to the scan test compliant self-synchronous signal control circuit of the preceding stage delays. Therefore, there is a possibility that output of the clock pulse CP and output of transfer request signal CO of scan test compliant self-synchronous signal control circuits of some stages except for the last stage make transitional changes. Such transitional changes, however, do not have any influence on the test operation, as will be described in connection with the overall operation of the scan test.

Thereafter, the acknowledge signal RI shown in FIG. 3M input to the circuit is set to the transfer permission state (change from L to H). Consequently, the scan compliant self-synchronous signal control circuit 103 of the third stage, that is, the last stage, of the pipeline operates in the following manner.

Specifically, as the acknowledge signal RI shown in FIG. 3M is set to the transfer permission state, NAND gate 209 is activated, flip-flop 208 holding the transfer request issuing state is set, and the CP output terminal 103CP shown in FIG. 3K changes from L to H. At the same time, a change from H to L of the request signal CO shown in FIG. 3L as the transfer request signal to the succeeding stage of the pipeline is output from CO output terminal 103CO through delay element 210, and NAND gate 209 is inactivated. Thus, flip-flop 207 holding the transfer request receiving state is reset, and a change from L to H of the acknowledge signal RO shown in FIG. 3J as the transfer permission signal to the second stage, that is, the preceding stage, of the pipeline is output from RO output terminal 103RO. Consequently, scan compliant self-synchronous signal control circuit 102 of the second stage of the pipeline operates in the following manner.

In scan compliant self-synchronous signal control circuit 102 of the second stage of the pipeline, the transfer permission represented by the acknowledge signal RO shown in FIG. 3J output from RO output terminal 103RO is received as an input of transfer permission of the acknowledge signal RI, and NAND gate 209 is activated. Accordingly, flip-flop 208 holding the transfer request issuing state is set, and CP output terminal 102CP of FIG. 3H changes from L to H. At the same time, a change from H to L of the request signal CO shown in FIG. 3I as a transfer request signal to the third stage, that is, the succeeding stage, of the pipeline is output from CO output terminal 102CO through delay element 210, and NAND gate 209 is inactivated. Accordingly, flip-flop 207 holding the transfer request receiving state is reset, and a change from L to H of the acknowledge signal RO indicating transfer permission to the first stage, that is, the preceding stage, of the pipeline is output from the RO output terminal 102RO, as shown in FIG. 3G.

Thereafter, similarly, the scan compliant self-synchronous signal control circuit 101 of the first stage of the pipeline operates in the following manner.

Specifically, CP output terminal 101CP changes from L to H as shown in FIG. 3E, and at the same time, a transfer request (change from H to L) shown in FIG. 3F is output from CO output terminal 101CO through delay element 210 to the second stage, that is, the succeeding stage of the pipeline. Along with this, transfer permission (change from L to H) by the acknowledge signal RO shown in FIG. 3D is output from RO output terminal 101RO to the preceding stage of the pipeline.

As described above, using the transfer permission (change from L to H) by the input of the acknowledge signal RI shown in FIG. 3M as a trigger, change at the CP output terminals 103CP, 102CP and 101CP, that is, change from L to H of the clock pulse, is propagated in a direction opposite to the data flow through the pipeline, from the third stage, that is, the last stage, through the second stage to the first stage of the pipeline.

In parallel with the propagation of the change at the CP output terminals, in each scan compliant self-synchronous signal control circuit, transfer request by the request signal CI (change of H to L) is input to CI input terminals 103CI and 102CI, flip-flop 207 holding the transfer request receiving state is set, and transfer reception by the acknowledge signal RO (change from H to L) is output from RO output terminals 103RO and 102RO to the preceding stages of the pipeline, respectively.

In the scan compliant self-synchronous signal control circuits of the stages except for the last stage of the pipeline, the acknowledge signal RO from the succeeding stage is received as an input of transfer reception of acknowledge signal RI (change from H to L), at RI input terminals 102RI and 101RI. Therefore, flip-flop 208 holding the transfer request issuing state is reset, CP output terminals 102CP and 101CP attain from H to L, and at the same time, transfer complete represented by the request signal CO (change from L to H) is output from CO output terminals 102CO and 101CO to the succeeding stages of the pipeline, respectively, through delay element 210.

Thereafter, when the acknowledge signal RI input to the circuit is set to the transfer reception state (change from H to L), scan compliant self-synchronous signal control circuit 103 of the third stage as the last stage of the pipeline operates in the following manner.

First, the acknowledge signal RI is input to RI input terminal 103RI as transfer reception (change from H to L), and therefore, flip-flop 208 holding transfer request issuing state is reset, CP output terminal 103CP changes from H to L, and at the same time, request signal CO representing transfer complete (change from L to H) is output from CO output terminal 103CO to the succeeding stage of the pipeline through delay element 210.

In this state, the scan reset signal SRB shown in FIG. 3B is input as an active pulse of H→ L→ H, and in response, flip-flop 207 holding the transfer request receiving state from the preceding stage of the pipeline in every scan compliant self-synchronous signal control circuit is set again. As a result, the circuit is set again to the state corresponding to the end of the third way of the four-way handshake, in which the RO output is at the transfer reception state and the CO output is at the transfer complete state.

Then, the scan reset signal SRB shown in FIG. 3B is input as an active pulse of H→ L→ H, the acknowledge signal RI shown in FIG. 3M is input as L→ H→ L, and using the change from L to H of the input acknowledge signal RI as a trigger, the clock pulse by the CP output can be propagated repeatedly, backward through the data flow from the last stage (third stage) through the second stage to the first stage of the pipeline.

Further, the propagation timing of the clock pulse by the CP output at this time is the same as that in the normal operation in which transfer permission/reception is input with the stages of the pipeline being filled with data as shown in FIGS. 11A to 11L. Therefore, by utilizing the above described operation in which the clock pulse is propagated using the transfer permission input as a trigger and utilizing the circuit configuration shown in FIGS. 1 and 2, a scan test circuit can be realized, which does not require separate careful timing adjustment for testing. Further, using the scan test, a hold timing test equivalent to a normal operation can be realized.

Figure 4:
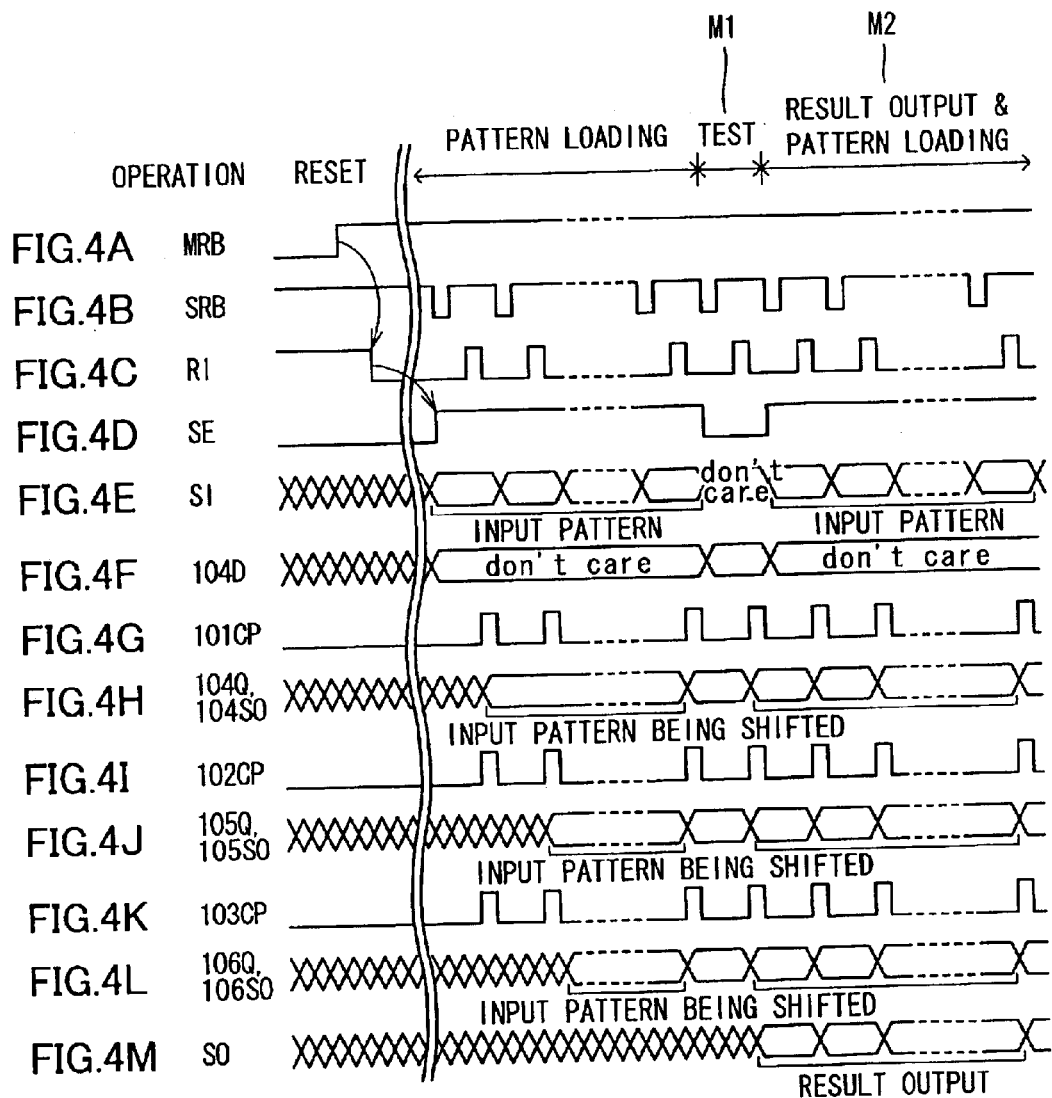
FIGS. 4A to 4M are timing charts representing an overall operation of the scan test.

An overall scan test operation utilizing the operation above will be described with reference to the timing charts of FIGS. 4A to 4M as well as to FIG. 1. The timing charts represent, in relation to register 104, changes of signals at data input terminal 104D, data output terminal 104Q, and a terminal 104SO for outputting scan data SO. Similarly, in relation to register 105, changes of signals at data output terminal 105Q, and a terminal 105SO for outputting scan data SO are represented, and in relation to register 106, changes of signals at data output terminal 106Q, and a terminal 106SO for outputting scan data SO are represented. After the circuit is reset by the input of reset signal MRB shown in FIG. 4A, the acknowledge signal shown in FIG. 4C is set to the transfer reception state of L and input to the circuit, and therefore, when the scan test enable signal SE of FIG. 4D is set to H and input, the scan chain is made valid.

Then, a desired test pattern data is set in registers 104, 105 and 106 through scan data input SI and the scan chain. For the clock pulse input at this time, the sequence of propagating the clock using the transfer permission input as a trigger described above, that is, the sequence in which the scan reset signal SRB shown in FIG. 4B is input as H→ L→ H and the acknowledge signal RI shown in FIG. 4C is input as L→ H→ L, is regarded as one test cycle. In this test cycle, the clock is propagated to the CP outputs 103CP, 102CP and 101CP of respective scan test compliant self-synchronous signal control circuits as shown in FIGS. 4K, 4I and 4G, to load the test pattern, in the test cycle.

By the loading operation of the test pattern data, levels of terminals 104Q, 104SO, 105Q, 105SO, 106Q and 106SO are established successively. After the reset, at the change of the scan reset signal SRB input for the first time from H→ L shown in FIG. 4B, there is a possibility that CP output and CO output of scan test compliant self-synchronous signal control circuits of some stages except for the last stage may experience transitional change. Even when the state of an internal register fluctuates because of the transitional change, the transitional change does not have any influence on the test operation, because such unstable state occurs before the start of a test, and by the pattern data loading operation that follows, the registers are surely set to the desired states.

When loading of the pattern data to registers 104, 105 and 106 is complete, the test operation M1 is performed. In the test operation, the scan test enable signal SE shown in FIG. 4D is set to L to invalidate the scan chain, one clock is input through the same clock input method as described above, and normally input data through the data path input DI and the outputs of combination circuits 107 and 108 between the stages are latched in registers 104, 105 and 106, respectively.

Thereafter, an operation M2 of outputting result and pattern loading is performed. Specifically, the scan test enable signal SE is set to H and input again to make valid the scan chain, and through the scan chain, values latched in respective registers are output from the scan data output SO and compared with the expected values. At the same time, the next test pattern data is set in the internal register through the scan chain. For the clock input at this time, the above described method is again utilized. Then, by the repetition of the operations M1 and M2, the scan test can be performed.

Second Embodiment

A second embodiment will be described in the following.

Figure 5:
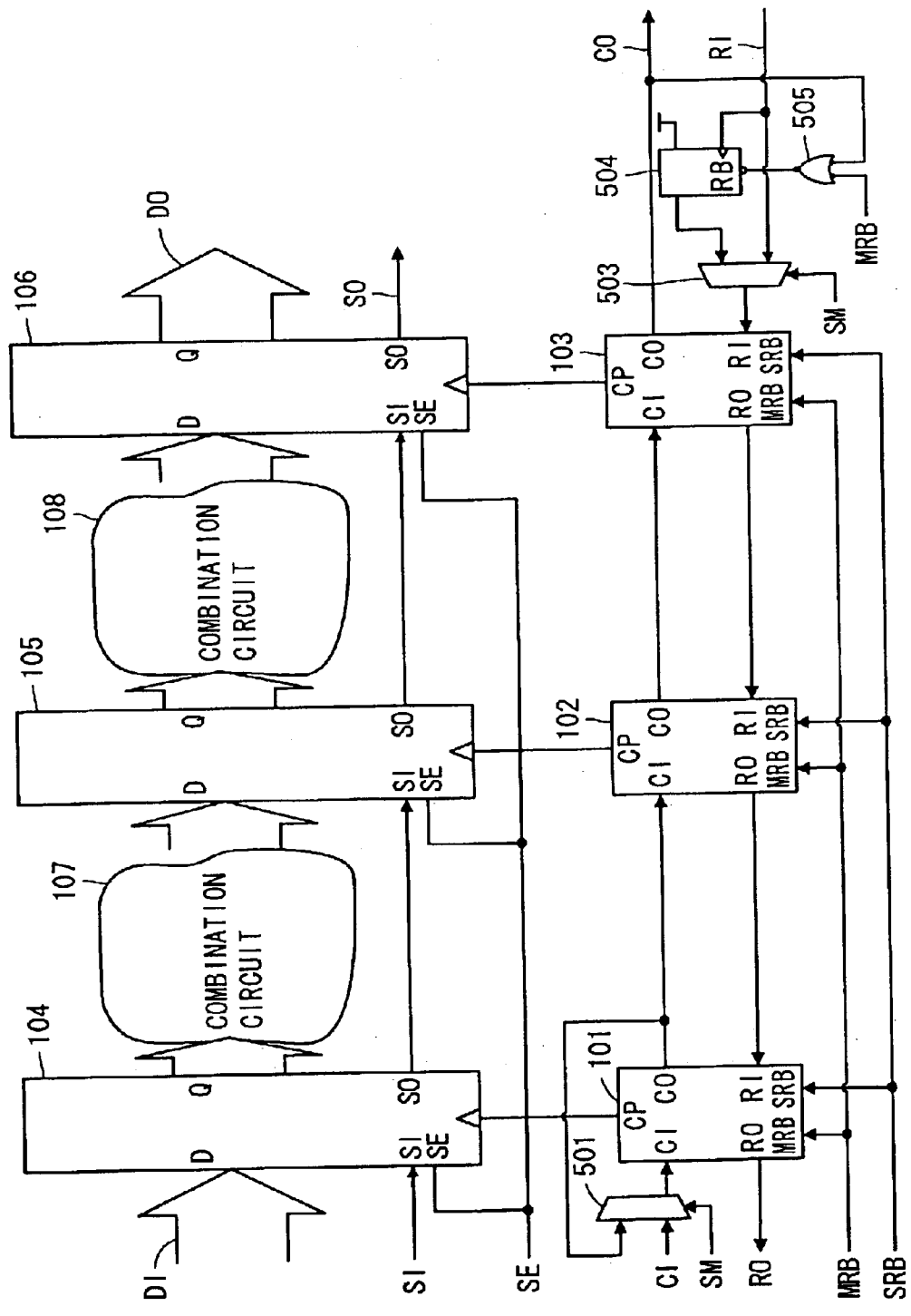
FIG. 5 shows a configuration of the self-synchronous logic circuit having a test circuit in accordance with a second embodiment.

FIG. 5 shows a configuration of a self-synchronous logic circuit having a test circuit in accordance with the second embodiment. The configuration of FIG. 5 includes, in addition to the configuration shown in FIG. 1, selectors 501 and 503, a register 504 and a gate 505.

In the scan test compliant self-synchronous signal control circuit 101 of the first stage of the pipeline, selector 501 has a function of feeding back the transfer request/complete signal output 101CO to the transfer request/complete signal input 101CI of itself, based on an input scan test mode signal SM, at the time of a scan test. The scan test mode signal switches whether the scan test circuit is to be made valid or not. Selector 503, register 504 and gate 505 are circuits for feeding back the transfer request signal output 103CO (change from H to L) to the transfer reception signal input 103RI (change from H to L) of itself, in the scan test compliant self-synchronous signal control circuit 103 of the third stage, that is, the last stage, of the pipeline at the time of a scan test.

When the input of the scan reset signal SRB is fixed at the inactive value of H and the scan chain is invalid, the circuit performs a normal operation, as in the first embodiment.

The operation of selector 501 shown in FIG. 5 in accordance with the level of the scan test mode signal SM will be described. When the scan test mode signal SM is set to the H level (level for the scan test operation), to the CI input 101CI of scan test compliant self-synchronous signal control circuit 101 of the first stage of the pipeline, transfer request 101CO output from itself to the scan test compliant self-synchronous signal control circuit 102 of the succeeding stage is input (fed back) through selector 501.

When there is no feedback through selector 501 (or when the scan test mode signal SM is at the L level), scan test compliant self-synchronous signal control circuit 101 does not return to the same state as the state after scan test compliant self-synchronous signal control circuit 101 received as an input the active pulse of H→ L→ H as the reset signal SRB (a state in which acknowledge signal RO is at the transfer reception state of L, and request signal CO is at the transfer complete state of H) simply by the sequence of the acknowledge signal RI of L→ H→ L input to the self-synchronous logic circuit. Accordingly, for inputting a scan clock, it is necessary to input the active pulse of H→ L→ H as the reset signal SRB alternately with the sequence input of the acknowledge signal RI of L→ H→L input to the self-synchronous logic circuit (see FIGS. 3A to 3M and 4A to 4M).

When there is a feedback through selector 501 (and the scan test mode signal SM is at the H level), the transfer request CO that is the transfer request/complete signal from the first stage to the second stage of the pipeline is also input to the first stage of itself. Therefore, simply by the sequence of the acknowledge signal RI of L→ H→ L, scan compliant self-synchronous signal control circuit 101 of the head stage of the pipeline can be returned to the state corresponding to the state after the active pulse of H→ L→ H as the reset signal SRB is input (the state in which acknowledge signal RO is at the transfer reception state of L and request signal CO is at the transfer complete state of H). As a result, when this configuration is employed, only one input of the active pulse for the reset signal SRB at the start is sufficient.

When the scan test mode signal SM is set to the L level (level for the normal operation), the reset signal SRB is fixed at the inactive value of H and the scan chain is invalid, as in the configuration of FIG. 1.

At this time, to the CI input 101CI of the scan test compliant self-synchronous signal control circuit 101 of the first stage of the pipeline, the transfer request CI input to the self-synchronous logic circuit itself is input through selector 501. The circuit operation at this time is the same as the normal operation (see FIGS. 10A to 10L and 11A to 11L).

Next, the operation of selector 503, register 504 and gate 505 shown in FIG. 5 will be described.

When the scan test mode signal SM is at the H level (level setting for the scan test operation), to the RI input 103RI of scan test compliant self-synchronous signal control circuit 103 of the last stage (third stage in the figure) of the pipeline, the transfer request from itself (change of 103CO of H→ L) is input (fed back) as a transfer reception of the acknowledge signal RI (change of 103RI of H→ L) through selector 503, register 504 and gate 505.

When there is no feedback through selector 503, register 504 and gate 505 (or when the scan test mode signal SM is at the L level), the fall of clock pulse CP (103CP) of scan test compliant self-synchronous signal control circuit 103 of the last stage of the pipeline becomes an operation that uses as a trigger the fall of the acknowledge signal RI input to the self-synchronous logic circuit (see FIG. 3M). At this time, the rise of clock pulse CP is propagated in the order of circuit 103→ 102→ 101 and the fall of clock pulse from circuit 102→ 101, while circuit 103 depends on the timing of change of the acknowledge signal RI from H→ L input to the self-synchronous logic circuit.

This configuration does not cause any problem when the stage registers of the pipeline use the rising edges only. When a falling edge is used, however, there arises a problem of hold timing at the time of a scan test. When there is a feedback through circuits 503 to 505 (and the scan test mode signal SM is at the H level), in the last stage of the pipeline, the transfer request (change of 103CO of H→ L) is passed through gate 505, activates the reset terminal RB of register 504 and hence resets (→ L) an output of register 504, which is input as a transfer reception (change of 103RI of H→ L) to itself, through selector 503. As a result, flip-flop 208 holding the transfer request issuing state in scan test compliant self-synchronous signal control circuit 103 is reset through NAND gate 209, clock pulse output (103CP) of scan test compliant self-synchronous signal control circuit 103 makes a transition of H→ L, and at the same time, transfer complete (change of 103CO of L→ H) is output from the last stage of the pipeline.

The transfer complete at the last stage of the pipeline inactivates the terminal RB of register 504 through gate 505. The output of register 504, however, does not change, and therefore, 103RI that is provided through selector 503 does not change, either. As a result, in this configuration, clock pulse CP changes from H→ L, before the change of H→ L of the acknowledge signal RI input to the self-synchronous logic circuit, and it follows that the fall of the clock pulse CP also propagates in the order or 103→ 102→ 101. Therefore, even when the stage registers of the pipeline use the falling edge, the problem of hold timing at the time of a scan test can be avoided.

After the series of changes described above, when the acknowledge signal RI input to the self-synchronous logic circuit changes from H→ L, there is a fall at the clock terminal of register 504. The output of register 504, however, does not change, and therefore, acknowledge signal 103RI that is provided through selector 503 does not change, either.

For the next application of the scan clock, when the acknowledge signal RI input to the self-synchronous logic circuit changes from L→ H, there is a rise at the clock terminal of register 504, and an input value fixed at H is provided at the output of register 504, which is input through selector 503 to the circuit 103 of the last stage as a transfer permission (change of 103 RI of L→ H).

The functions of circuits 503 to 505 when the scan test mode signal SM is at the H level will be summarized. The transfer permission (change of 103RI of L→ H) to scan test compliant self-synchronous signal control circuit 103 is generated using, as a trigger, a transfer permission of the acknowledge signal RI (change of RI of L→ H) applied externally as in the case where circuits 503 to 505 are not provided, whereas the transfer reception (change of 103RI of H→ L) to the self-synchronous signal control circuit 103 is generated using, as a trigger, not the transfer reception of the acknowledge signal RI (change of RI of H→ L) applied externally but the transfer request (change of 103CO of H→ L) from the self-synchronous signal control circuit 103.

When the scan test mode signal SM is at the L level (level setting for a normal operation), it is necessary that the reset signal SRB is fixed at the inactive value of H and the scan chain is invalid, as in the case of FIG. 1.

To the RI input 103RI of scan test compliant self-synchronous signal control circuit 103 of the last stage of the pipeline, the acknowledge signal RI that is input to the self-synchronous logic circuit is input through selector 503. The circuit operation at this time is the same as that of the normal operation (see FIGS. 10A to 10L and 11A to 11L).

Figure 6:
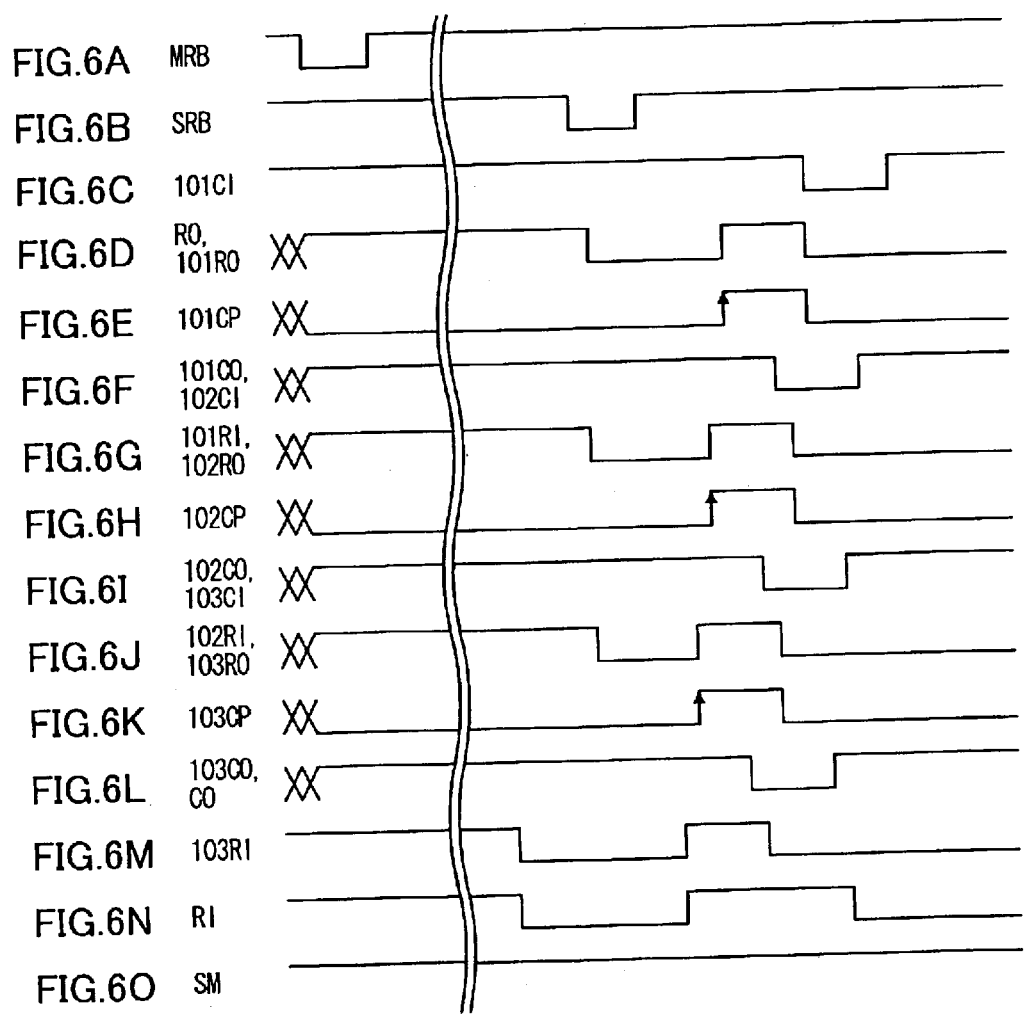
FIGS. 6A to 6O are timing charts representing an operation of the scan test compliant self-synchronous signal control circuit shown in FIG. 5, at the time of a scan test.

The operation of the scan test compliant self-synchronous signal control circuit at the time of a scan test is represented by the timing charts of FIGS. 6A to 6O. Difference in operation from the first embodiment will be discussed, except that the scan test mode signal SM to make valid the scan test circuit is input, fixed at H as shown in FIG. 6O.

The first difference is that by the feedback of the transfer request/complete signal using selector 501, to the CI input 101CI shown in FIG. 6C of scan test compliant self-synchronous signal control circuit 101 of the first stage of the pipeline, the request signal CO, which is the transfer request (change from H to L)/complete (change from L to H) from itself, is input. Consequently, from RO output terminal 101RO, the acknowledge signal RO of FIG. 6D representing transfer reception (change form H to L) to the preceding stage of the pipeline is output. Accordingly, only by the input of the acknowledge signal RI shown in FIG. 6N in accordance with the sequence of L→ H→ L, the state after the input of the scan reset signal SRB of FIG. 6B as an active pulse H→ L→ H is recovered.

Therefore, by simply inputting the active pulse of the scan reset signal SRB only once, it becomes possible thereafter to propagate the clock pulse CP output backward through the pipeline from the last stage to the first stage repeatedly, using the change of the acknowledge signal RI from L to H as a trigger.

The second difference is that by the feedback from the transfer request signal CO output to the transfer reception signal input using selector 503, register 504 and gate 505, to the RI input 103 RI of scan test compliant self-synchronous signal control circuit 103 of the third stage, that is, the last stage, of the pipeline the transfer request (change from H to L) of itself is input. Consequently, before the transfer reception input (change from H to L) shown in FIG. 6N of the acknowledge signal RI to the circuit, CP output terminal 103CP changes from H to L, and from the CO output terminal 103CO, transfer complete (change from L to H) to the succeeding stage of the pipeline is output as shown in FIG. 6L. Accordingly, before the change of the input acknowledge signal RI from H to L, CP output terminal 103CP of the third stage as the last stage of the pipeline can be changed from H to L. Therefore, it becomes possible to apply the scan test even to a circuit in which a falling edge is used in the last stage of the pipeline.

Figure 7:
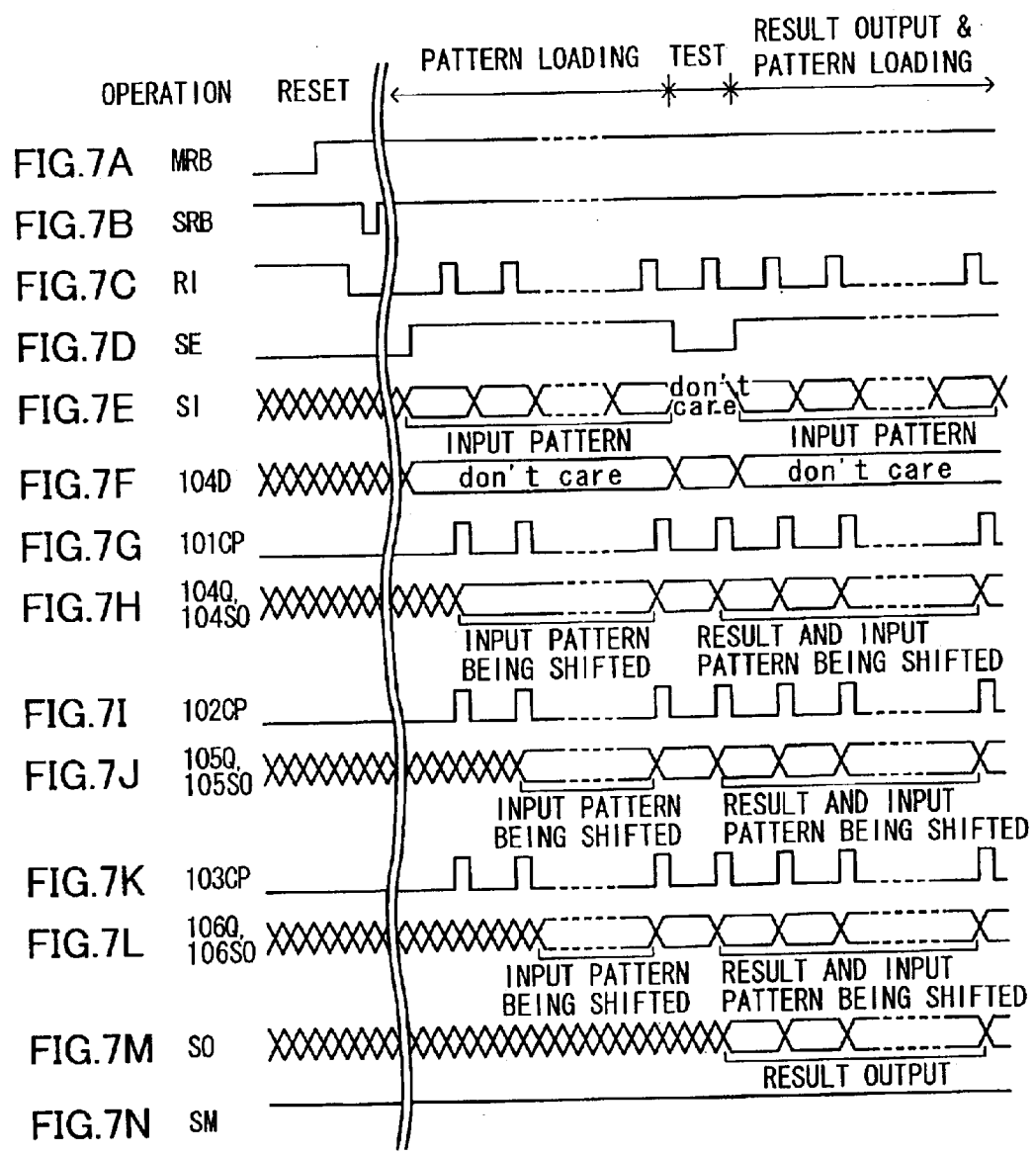
FIGS. 7A to 7N are timing charts representing an overall operation of the scan test in accordance with the second embodiment.
Figure 8:
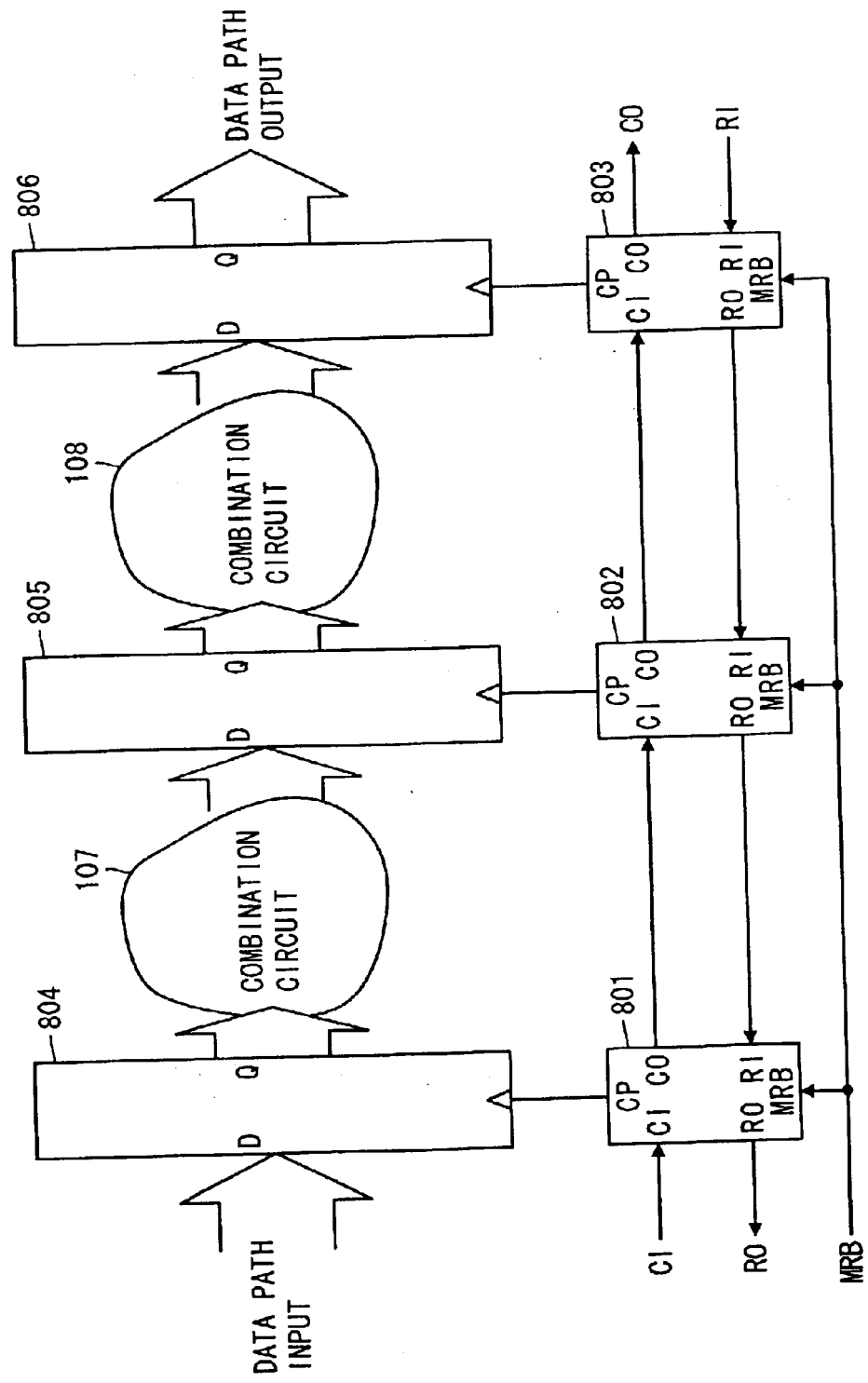
FIG. 8 shows a characteristic portion of a conventional circuit having a self-synchronous pipeline.
Figure 9:
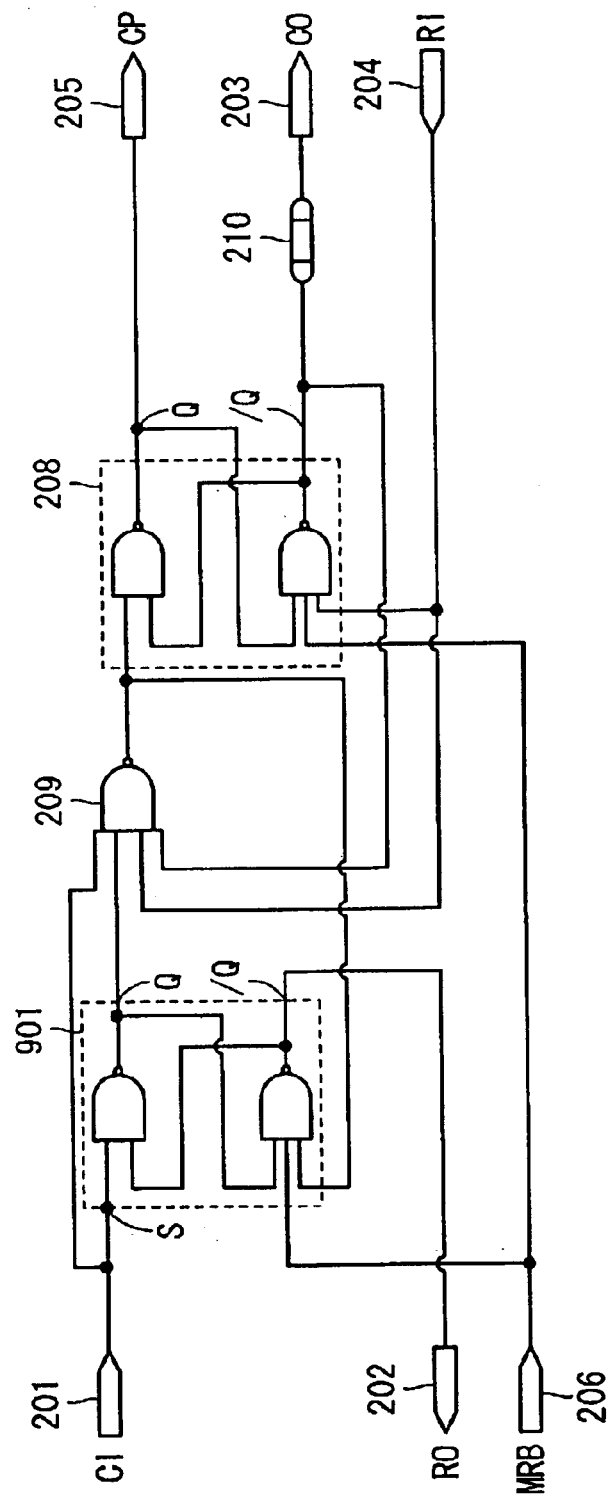
FIG. 9 is a specific block diagram of the self-synchronous signal control circuit shown in FIG. 8.
Figure 10:
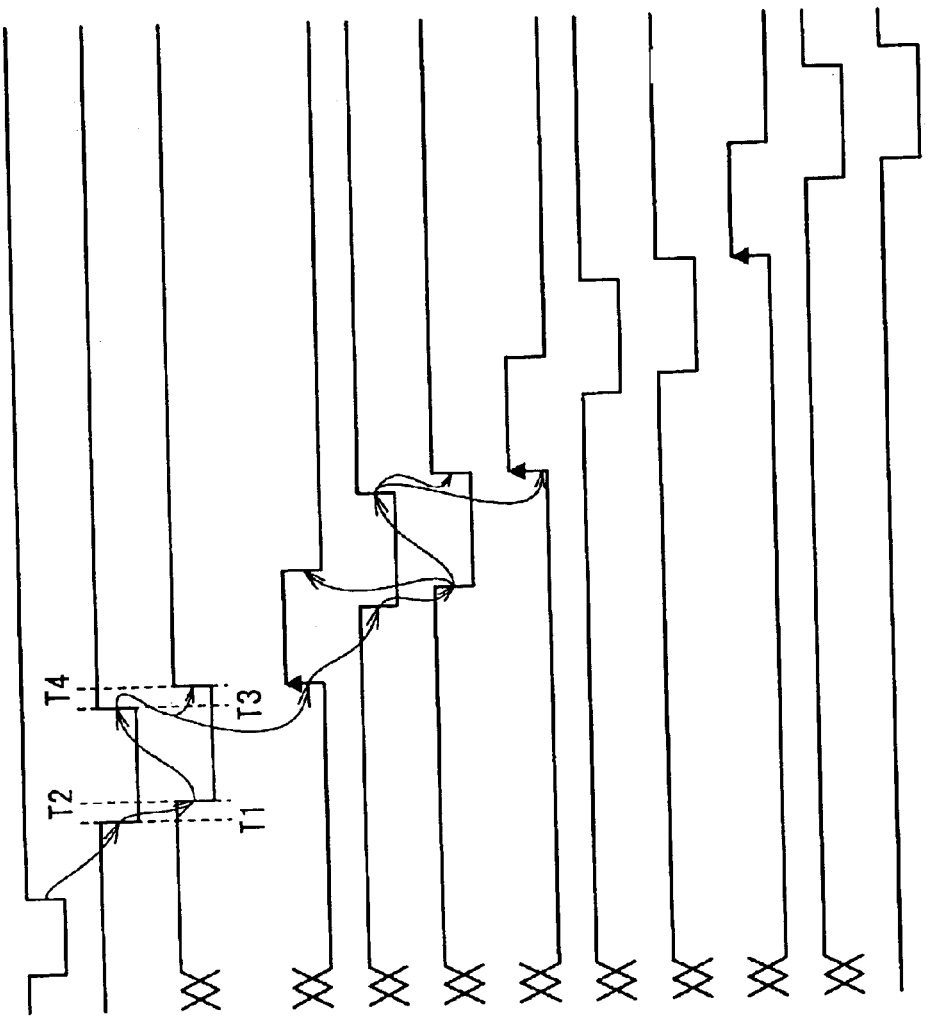
FIGS. 10A to 10L are timing charts illustrating an operation of FIGS. 8 and 9.
Figure 11:
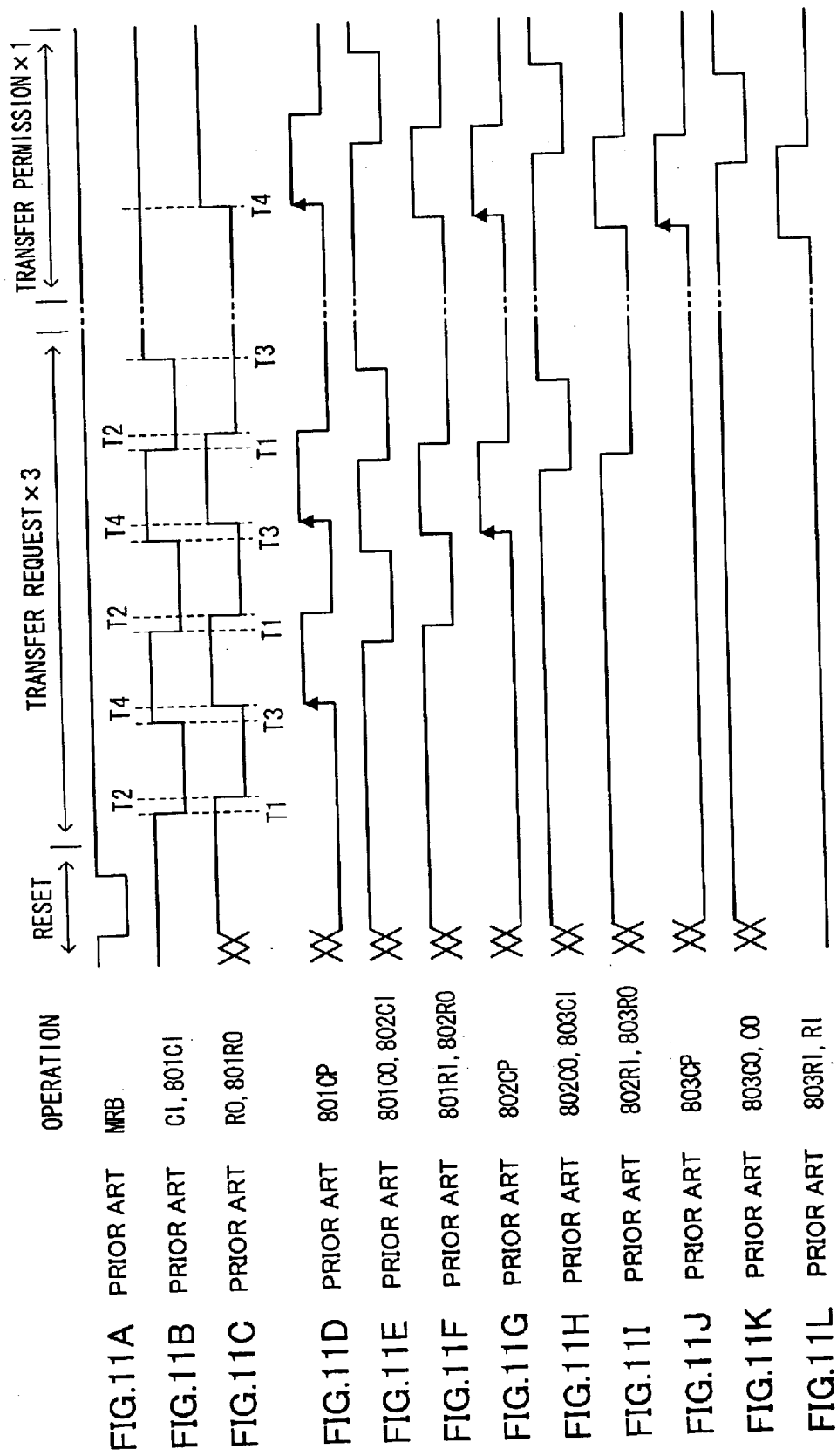
FIGS. 11A to 11L are timing charts illustrating an operation of another example of the self-synchronous signal control circuit shown in FIG. 8.
Figure 12:
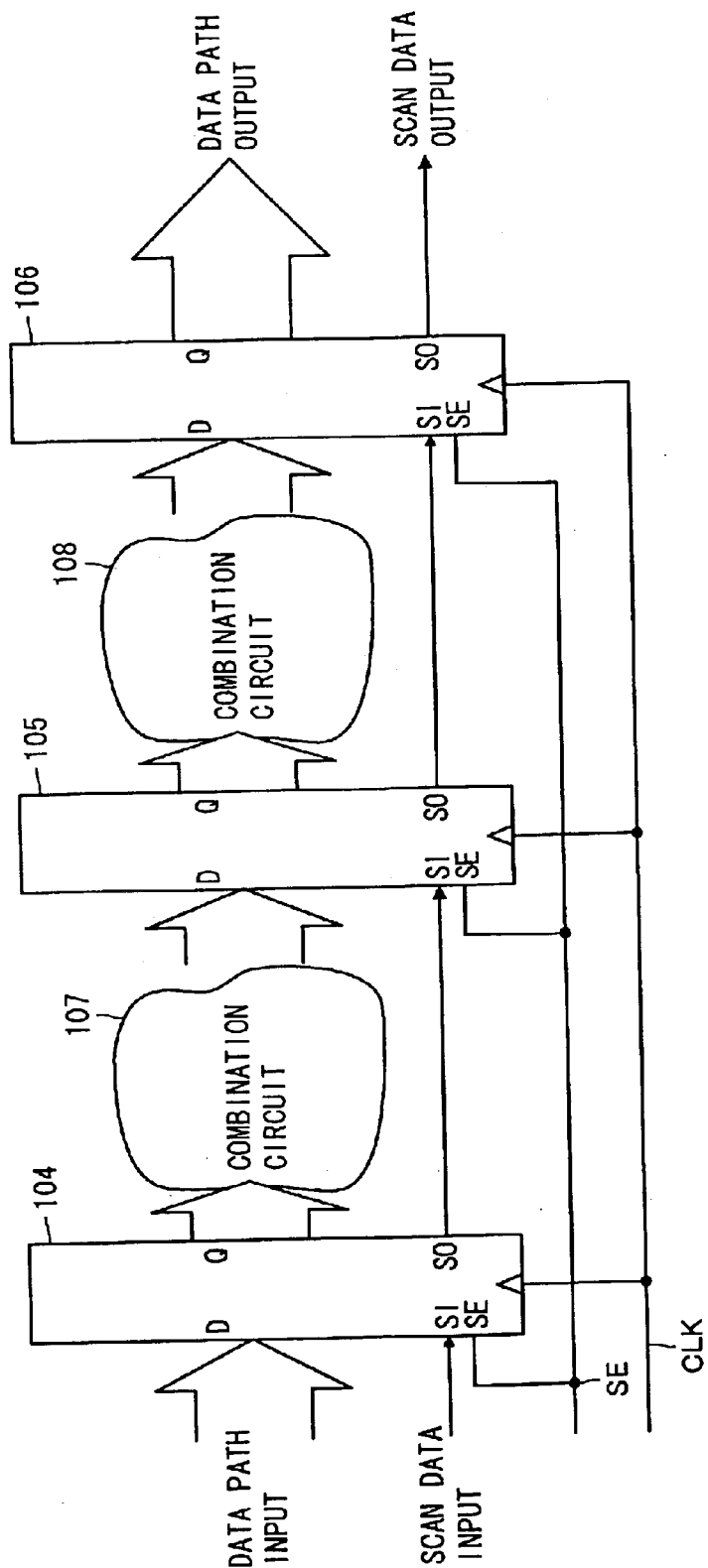
FIG. 12 represents an example of a synchronous circuit operating in accordance with a common clock, in compliance with the scan test method.

The overall scan test operation in accordance with the second embodiment is represented by the timing charts of FIGS. 7A to 7N. Difference in operation from the first embodiment will be discussed, except that the scan test mode signal SM to make valid the scan test circuit is input, fixed at H as shown in FIG. 7N. The active pulse input shown in FIG. 7B of the scan reset signal SRB is given only once at the start, and thereafter, clock input is performed repeatedly in accordance with the sequence of L→ H→ L shown in FIG. 7C of the acknowledge signal RI. Accordingly, it becomes possible to perform a scan test regarding the input of the acknowledge signal RI simply as the scan clock.

When the self-synchronous logic circuit in accordance with the above described embodiment is applied to a data driven processor, a scan test circuit that does not require any timing adjustment of the scan clock can be implemented by adding minor circuitry, while maintaining the advantage of the data driven processor that physical design of a large scale LSI is easy as large scale clock distribution is unnecessary. Further, the hold test timing can be realized easily, using the self-synchronous logic circuit, and therefore, reliability can be improved from the aspect of reduced period of developing a large scale data driven processor and the aspect of function/timing.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A self-synchronous logic circuit having a test function, comprising:
   registers holding data, connected in a plurality of stages for a pipeline; and
   self-synchronous signal control circuits provided corresponding to said registers connected in a plurality of stages, respectively; wherein
   said self-synchronous signal control circuits perform four-way handshake in which, when transfer permission to a preceding stage is applied in a first way, a transfer request from the preceding stage is received as an input together with data output from the register of the preceding stage, upon input of the transfer request, transfer reception is applied to the preceding stage in a second way, when the transfer reception is received as an input by the preceding stage, transfer complete is received as an input from the preceding stage in a third way, and when the transfer complete is received as an input and transfer permission is applied from the succeeding stage in a fourth way, transfer permission is applied to the preceding stage and data from the preceding stage is taken and held by the register and data is output to the succeeding stage to apply transfer request to the succeeding stage; and said registers have a function of successively transferring data in a normal operation and in a test operation;

said self-synchronous logic circuit setting all said self-synchronous signal control circuits to a state of the third way of said handshake and thereafter, applying transfer permission and transfer reception to said self-synchronous signal control circuit of the last stage in a test operation.

2. The self-synchronous logic circuit having a test function according to claim 1, wherein setting of all said self-synchronous signal control circuits to a state of the third way of said handshake and application of said transfer permission and transfer reception to said self-synchronous signal control circuit of the last stage are repeated in a test operation.

3. The self-synchronous logic circuit having a test function according to claim 1, further comprising a last stage signal processing unit for applying, in said test operation, said transfer request output from said self-synchronous signal control circuit of the last stage to the succeeding stage to the self-synchronous signal control circuit itself, as said transfer reception from the succeeding stage.

4. The self-synchronous logic circuit having a test function according to claim 1, wherein said self-synchronous logic circuit sets all said self-synchronous signal control circuits to a state of the third way of said handshake, applies said transfer permission and transfer reception to said self-synchronous signal control circuit of the last stage of said pipeline, and in addition, said transfer request is applied repeatedly to said self-synchronous signal control circuit of a head stage of said pipeline in the test operation.

5. The self-synchronous logic circuit having a test function according to claim 1, further comprising a head stage signal processing unit for applying, in said test operation, said transfer request and transfer complete output from said self-synchronous signal control circuit of the head stage of said pipeline to the succeeding stage, to the self-synchronous signal control circuit itself as said transfer request and transfer complete.

6. A method of testing a self-synchronous logic circuit including registers holding data, connected in a plurality of stages for a pipeline, and self-synchronous signal control circuits provided corresponding to said registers connected in a plurality of stages, said self-synchronous signal control circuits performing four-way handshake in which, when transfer permission to a preceding stage is applied in a first way, a transfer request from the preceding stage is received as an input together with data output from the register of the preceding stage, upon input of the transfer request, transfer reception is applied to the preceding stage in a second way, when the transfer reception is received as an input by the preceding stage, transfer complete is received as an input from the preceding stage in a third way, and when the transfer complete is received as an input and transfer permission is applied from the succeeding stage in a fourth way, transfer permission is applied to the preceding stage and data from the preceding stage is taken and held by the register and data is output to the succeeding stage to apply transfer request to the succeeding stage; wherein said registers have a function of successively transferring said data in a normal operation and in a test operation;

said method comprising the state setting step of setting all said self-synchronous signal control circuits to a state of the third way of said handshake in a test operation; and after the setting by said state setting step, applying transfer permission and transfer reception to said self-synchronous signal control circuit of the last stage of said pipeline.

* * * * *